(12) United States Patent
Matsuda

(10) Patent No.: US 6,316,297 B1
(45) Date of Patent: Nov. 13, 2001

(54) SEMICONDUCTOR DEVICE AND METHOD FOR FABRICATING THE SAME

(75) Inventor: Hajime Matsuda, Yamanashi-ken (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/436,470

(22) Filed: Nov. 8, 1999

(30) Foreign Application Priority Data

Dec. 28, 1998 (JP) .................................................. 10-372198

(51) Int. Cl.$^7$ ................................................. H01L 21/338
(52) U.S. Cl. ........................... 438/174; 438/175; 438/176; 438/72; 438/69; 438/29; 438/167; 438/514; 438/525; 438/527; 257/98; 257/213; 257/336; 257/350
(58) Field of Search ................................. 438/174–6, 72, 438/69, 29, 167, 549, 514, 525, 527, 542; 257/98, 213, 336, 350

(56) References Cited

U.S. PATENT DOCUMENTS

| | | | |
|---|---|---|---|
| 4,997,779 | * | 3/1991 | Kohno ..................................... 437/41 |
| 5,304,794 | * | 4/1994 | Malone et al. ........................ 250/214 |
| 5,534,449 | * | 7/1996 | Dennison et al. ...................... 437/34 |
| 6,054,377 | * | 4/2000 | filipiak et al. ........................ 438/619 |

FOREIGN PATENT DOCUMENTS

| | | |
|---|---|---|
| 57-153474 | 9/1982 | (JP) . |
| 5-21454 | 1/1993 | (JP) . |
| 6-291138 | 10/1994 | (JP) . |

* cited by examiner

*Primary Examiner*—Matthew Smith
*Assistant Examiner*—Granvill D. Lee, Jr.
(74) *Attorney, Agent, or Firm*—Armstrong, Westerman, Hattori, McLeland & Naughton, LLP

(57) ABSTRACT

The method for fabricating a semiconductor device comprises the steps of forming on a semiconductor substrate a gate electrode, and an eave-shaped film of an inorganic material formed on the upper surface of the gate electrode and having a eave-shaped portion projected beyond the edge of the gate electrode; and ion-implanting a dopant with the gate electrode as a mask and with the eave-shaped portion of the eave-shaped film as a through film to form a first diffusion layer in the semiconductor substrate immediately below the eave-shaped portion and a second diffusion layer which is connected to the first diffusion layer, and is deeper and has a higher dopant concentration than the first diffusion layer, in the semiconductor substrate in a region where the eave-shaped film is not formed.

10 Claims, 18 Drawing Sheets

SEMICONDUCTOR DEVICE AND METHOD FOR FABRICATING THE SAME

DETAILED DESCRIPTION OF THE INVENTION

The present invention relates to a field-effect semiconductor device using a compound semiconductor substrate, and a method for fabricating the same.

Self-alignment MESFETs using refractory metals as gate electrode materials are relatively easy in the fabrication steps and have thermally stable structures. Because of these advantages the self-alignment MESFETs are widely applied to compound semiconductor integrated circuits and are produced in GaAs gate arrays, amplification ICs for mobile communication apparatuses, such as mobile telephones, etc., ICs for optical communication.

Progress of the recent information communication requires ICs having higher operation speed. For higher operation speed it is one effective means to shorten gate lengths of the used FETS. However, there is a risk that short gate lengths cause the so-called short channel effect. Accordingly, in using short gate lengths it is necessary to design devices in consideration of suppression of the short channel effect.

Under these circumstances, in the compound semiconductor MESFETs the simple structure using a buried P layer has been taken over by BP-LDD structure with LDD (Lightly Doped drain) structure added to the simple structure. However, the conventional BP-LDD structure has become insufficient to suppress the short channel effect in order to meet the requirement of a shorter channel of a 0.2 μm gate length. Then, the structure additionally including an n"-layer disposed between the so-called n'-layer and channel layer of the BP-LDD structure and having a carrier concentration intermediate concentrations of the n'-layer and the channel layer is proposed (this structure is hereinafter called a developed BP-LDD structure).

A process for fabricating a compound semiconductor MESFET having the conventional developed BP-LDD structure will be explained with reference to FIGS. 14A–14C and 15A–15B. FIGS. 14A–14C and 15A–15B are sectional views of the semiconductor device in the steps of the method for fabricating the conventional semiconductor device.

First, Mg (magnesium) as an acceptor impurity and a Si (silicon) as a donor impurity are ion-implanted into a MESFET region of a GaAs substrate 100 to form a buried p-layer 102 of the Mg-doped layer and an n-channel layer 104 of the Si-doped layer.

Then, a WSi (tungsten silicide) film is deposited on the entire surface by, e.g., sputtering and patterned to form a gate electrode 106 of the WSi film (FIG. 14A).

Then, resist 108 is formed by the usual lithography techniques, covering the region other than the MESFET region.

Next, Si is ion-implanted with the resist 108 and the gate electrode 106 as a mask to form an n"-layer 110 in the GaAs substrate 100 (FIG. 14B).

Then, after the resist 108 is removed, an SiN (silicon nitride) film is deposited on the entire surface by, e.g., CVD method to form a through film 112 of the SiN film.

Next, a resist 114 is formed by the usual lithography techniques, covering the region other than the MESFET region.

Then, Si is ion-implanted with the resist 114, the gate electrode 106, the through film 112 on the sidewall of the gate electrode 106 as a mask to form an n'-layer 116 spaced from the edges of the gate electrode 106 by a distance corresponding to a film thickness of the through film 112 (FIG. 14C).

Next, an insulation film is deposited on the entire surface and etched back to form on the sidewall of the gate electrode 106 a sidewall insulation film 118 having a width larger than the film thickness of the through film 112.

Then, a resist 120 is formed by the usual lithography techniques, covering the region other than the MESFET region.

Next, Si is ion-implanted with the resist 120, the gate electrode 106 and the sidewall insulation film 118 as a mask to form an $n^+$-layer 122 spaced from the sidewall of the gate electrode 106 by a distance corresponding to the width of the sidewall insulation film 118 (FIG. 15A).

Next, after the sidewall insulation film 118 is removed, a heat treatment for activating the impurities is performed.

Then, an ohmic electrode 124 are formed on the $n^+$-layer 122, and the MESFET is completed (FIG. 15B).

Thus, the MESFET of the developed BP-LDD structure including the source/drain diffusion layer formed of the n"-layer 110, the n'-layer 116 and the $n^+$-layer 122 is formed.

Japanese Patent Laid-Open Publication No. 153474/1982 proposes, as one technique for forming the LDD structure, a technique for simultaneously forming two diffusion layers having different carrier profiles by once ion implantation. In this technique, when a gate electrode is patterned with a resist as a mask, the gate electrode is processed to have a smaller width than the resist to form an eave-shaped resist film on the gate and in this state the ion implantation is performed, whereby an impurity is implanted shallow near the gate electrode below the eave-shaped resist film and deep in a region spaced from the eave-shaped resist film.

A method for fabrication a MESFET using the eave-shaped resist film formed on the gate electrode will be explained with reference to FIGS. 16A–16C and 17A–17B. FIGS. 16A–16C and 17A–17B are sectional views of another conventional semiconductor device in the steps of the method for fabricating the same.

First, Mg as an acceptor impurity and Si as a donor impurity are ion-implanted into a MESFET region of a GaAs substrate 100 to form a buried p-layer 102 of the Mg-doped layer, and an n-channel layer 104 of the Si-doped layer.

Then, a WSi film 126 is deposited on the entire surface by, e.g., sputtering method (FIG. 16A).

Then, a resist having a pattern for forming a gate electrode is formed on the WSi film 126 by the usual lithography techniques.

Next, the WSi film 126 is dry-etched with the resist as a mask under conditions where the etching progresses also horizontally to the GaAs substrate 100. Thus, the gate electrode 106 formed of the WSi film 126 and the eave-shaped resist film 128 formed on the gate electrode 106 are formed (FIG. 16B).

Next, Si is ion-implanted with the eave-shaped resist film 128 and the gate electrode 106 as a mask. In this ion implantation, because of the eave-shaped resist film 128 formed on the gate electrode 106, the Si ions are implanted in a vicinity of the edge of the gate electrode 106 below the eave-shaped resist film 128 substantially at lower acceleration energy and in a smaller dose. Accordingly, an n'-layer 116 which has a lower concentration and is shallow and an $n^+$-layer 122 which has a higher concentration and is deep are formed (FIG. 16C).

Then, a resist 130 covering the MESFET region and exposing a device isolation region is formed by the usual lithography techniques.

Then, p-type impurity is ion-implanted with the resist 130 as a mask to form a device isolation layer 132 (FIG. 17A).

Then, an ohmic electrode 124 is formed on the n+-layer 122, and the MESFET is completed (FIG. 17B).

Thus, MESFET of the BP-LDD structure having the source/drain diffusion layer form of the n'-layer 116 and the n+-layer 122 is fabricated by a small number of fabrication steps.

In order to suppress the short channel effect it is effective to shallow the channel layer. To thin the channel layer in accordance with a scaling rule the n'-layer and the n+-layer must be also shallowed. However, shallowing these layer of the diffusion layer makes small a sectional area of a region between the source and the drain where current flows. Accordingly, it is considered that a resistance value will increase, and a channel conductance Gm will not be improved, which will make improvement of the FET by shortening the channel insufficient.

On the other hand, when impurity concentrations of the respective doped layers are increased to reduce a resistance value, because of the structure of the MESFET in which the gate electrode directly contacts the substrate differently from the MOS structure. used in silicon LSIs, increase of carrier concentrations of the surface of the substrate causes leak current between the gate electrode and the substrate. Good Schottky characteristics cannot be maintained. Especially, it is an significant problem to maintain a backward breakdown voltage on the side of the drain in terms of characteristics of the FET.

Here, it is proposed that a MESFET has an offset structure including a prescribed offset region 134 between the gate electrode 106 and the n'-layer 116 as shown in FIG. 18, whereby a leak current is decreased for improved breakdown voltage.

Shortening the channel is accompanied also by a problem of resistance increase due to decrease of a sectional area of the gate electrode. For depression of the resistance increase is proposed a T-shaped gate structure including a low resistance layer of Au (gold) formed on a refractory metal forming Schottky junction. A known general process for forming the T-shaped gate structure includes spin-coating an organic film, such as a resist or others, or a planarization film, such as OCD or others after the gate electrode has been formed, and etching back the film to expose the upper part of the gate electrode, and forming a low resistance layer on the exposed part by electro-plating, electro-less plating, selective CVD, vapor deposition/lift-off or others.

However, in the method for fabricating the semiconductor device of the conventional developed BP-LDD structure shown in FIGS. 14A–14C and 15A–15B, the n"-layer 110, the n'-layer 116 and the n+-layer 122 forming the source/drain diffusion layer are separately formed, which is a cause for increasing fabrication steps, increasing fabrication costs.

In this process, a region where a region in which the ion-implantation for forming the n"-layer 110 is performed and a region in which the ion-implantation for forming the n'-layer 116 is performed overlap each other is unavoidably present, so that an impurity concentration of the surface of the substrate in the overlapped region becomes unnecessarily high. Accordingly, unless a region of the n"-layer 110 is made large and the n'-layer 116 is sufficiently spaced from the gate electrode 106, the Schottky junction has low breakdown voltage. The increase of the n"-layer 110 causes resistance increase, affecting high speed operation of the MESFET.

In the method for fabricating the semiconductor device described in Japanese Patent Laid-Open Publication No. 153474/1982, as shown in FIGS. 16A–16C and 17A–17B, times of ion-implantation for forming the n'-layer 116 and the n+-layer 122 can be smaller, which can preclude the problem of the impurity concentration increase of the surface of the substrate.

However, in order to suppress the short channel effect in a region where a gate length is as short as below 0.2 $\mu$m, it is necessary that the channel layer 104 has a 10–15 nm-thick, the n'-layer 116 has a 40–50 nm-thick, and the n"-layer 110 has a 20–30 nm-thick. The semiconductor device fabrication process described in Japanese Patent Laid-Open Publication No. 153474/1982 using the eave-shaped resist film 128 is difficult to control a depth of the diffusion layer. That is, to control a depth of the diffusion layer to said thickness it is necessary to control a thickness of the eave-shaped resist film 128 to be in the order of 10 nm. However, it is very difficult to form the eave-shaped resist film 128 having a thickness thus subtly controlled by the resist.

Furthermore, in the semiconductor device fabrication process described in Japanese Patent Laid-Open Publication No. 153474/1982, a gate length is defined by a pattern size of the resist and an amount of the side etching. It will be very difficult to secure precision of a gate length as the gate length is shorter.

Furthermore, in the semiconductor device fabrication process described in Japanese Patent Laid-Open Publication No. 153474/1982, as shown in FIG. 16C, the structure having the eave-shaped resist film 128 left only on the gate electrode 106 is used, which permits ions to be implanted also in the device isolation region when the n'-layer 116 and the n+-layer 122 are formed. Accordingly, the step of forming the device isolation layer 132 for isolating devices (the step shown in FIG. 17A) must be added, with results of an increased total number of the ion implantation, an increase number of masks. Cost reduction cannot be expected.

In the structure having the offset region 134 disposed between the n'-layer 116 and the gate electrode 106, as of the conventional semiconductor device shown in FIG. 18, a breakdown voltage at the Schottky junction can be high. However, because a channel length of a small sectional area is substantially long, a resistance between the source and the drain is increased, which is a barrier to high speed operation of the MESFET. To prevent the resistance increase, it is considered to dispose the offset region 134 only on the drain side, but when the n"-layer 110 become necessary as the channel becomes shorter, the offset forming step and the n"-layer forming step are necessary in addition to the step of forming the conventional BP-LDD structure, which adds many steps.

In forming the T-shaped gate electrode by the method for fabricating the MESFET having the above-described conventional T-shaped gate electrode, a height of the horizontal portion of the T-shaped gate from the surface of the substrate is a problem. When a height of the horizontal portion of the T-shaped gate is small, a parasitic capacitance increases, and a shut-off frequency $f_t$ is small. The height is controlled by a thickness of the gate electrode and an etching back amount. However, generally inter-wafer uniformity and intra-plane uniformity of an etching-back amount are inferior to film thickness fluctuation in film forming by sputtering, etc., and etching-back disuniformity is related directly to RF characteristics fluctuation of the MESFET.

SUMMARY OF THE INVENTION

A first object of the present invention is to provide a semiconductor device having the developed BP-LDD structure fabricated by a small number of steps and a method for fabricating the same.

A second object of the present invention is to provide a semiconductor device which can prevent breakdown voltage decrease at the Schottky junction of the MESFET and a method for fabricating the same.

A third object of the present invention is to provide a semiconductor device including a T-shaped gate structure and having low resistance and little RF characteristics fluctuation and a method for fabricating the same.

The above-described objects are achieved by a semiconductor device comprising: a gate electrode formed on a semiconductor substrate, a source diffusion layer formed in the semiconductor substrate on one side of the gate electrode, and a drain diffusion layer formed in the semiconductor substrate on the other side of the gate electrode, the drain diffusion layer including a first diffusion layer formed spaced from one edge of the gate electrode, a second diffusion layer which is connected to the first diffusion layer, and is deeper and has a higher dopant concentration than the first diffusion layer, and a third diffusion layer which is connected to the second diffusion layer, and is deeper and has a higher dopant concentration than the second diffusion layer, the source diffusion layer including a fourth diffusion layer which is formed in a region extended outer of a vicinity of the other edge of the gate electrode, and is substantially as deep as the second diffusion layer and has a dopant concentration substantially equal to that of the second diffusion layer, and a fifth diffusion layer connected to the fourth diffusion layer, and is as deep as the third diffusion layer and a dopant concentration substantially equal to that of the third diffusion layer.

The above-described objects are also achieved by a semiconductor device comprising: a gate electrode formed on a semiconductor substrate, a source diffusion layer formed in the semiconductor substrate on one side of the gate electrode, and a drain diffusion layer formed in the semiconductor substrate on the other side of the gate electrode, an eave-shaped film of a conducting film formed on the gate electrode, projected beyond an edge of the gate electrode, and an electrode layer formed on the eave-shaped film, the gate electrode, the eave-shaped film and the electrode layer forming a T-shaped gate electrode.

In the above-described semiconductor device, it is possible that the source diffusion layer and the drain diffusion layer each include a first diffusion layer formed in a region outer of a vicinity of an edge of the gate electrode, a second diffusion layer which is connected to the first diffusion layer, and is deeper and has a higher dopant concentration than the first diffusion layer, a third diffusion layer which is connected to the second diffusion layer, and is deeper and has a higher dopant concentration than the second diffusion layer.

In the above-described semiconductor device, it is possible that the drain diffusion layer includes a first diffusion layer formed spaced from one edge of the gate electrode, a second diffusion layer which is connected to the first diffusion layer, and is deeper and has a higher dopant concentration than the first diffusion layer, and a third diffusion layer which is connected to the second diffusion layer, and is deeper and has a higher dopant concentration than the second diffusion layer, and the source diffusion layer includes a fourth diffusion layer which is formed in a region extended outer of a vicinity of the other edge of the gate electrode, and is substantially as deep as the second diffusion layer and has a dopant concentration substantially equal to that of the second diffusion layer, and a fifth diffusion layer which is connected to the fourth diffusion layer, and is as deep as the third diffusion layer and a dopant concentration substantially equal to that of the third diffusion layer.

The above-described objects are also achieved by a method for fabricating a semiconductor device comprising the steps of: forming on a semiconductor substrate a gate electrode, and an eave-shaped film of an inorganic material having an eave-shaped portion projected beyond an edge of the gate electrode formed on the upper surface of the gate electrode; and ion-implanting a dopant with the gate electrode as a mask and with the eave-shaped film as a through film to form a first diffusion layer in the semiconductor substrate immediately below the eave-shaped portion of the eave-shaped film and a second diffusion layer which is deeper and has a higher dopant concentration than the first diffusion layer, in the semiconductor substrate in a region where the eave-shaped film is not formed.

In the above-described method for fabricating a semiconductor device, it is possible that the method further comprises: the step of forming on the sidewall of the gate electrode a mask film having a larger width than that of the eave-shaped portion after the step of forming the first diffusion layer and the second diffusion layer; and the step of ion implanting a dopant with the mask film as a mask to form a third diffusion layer which is deeper and has a higher dopant concentration than the second diffusion layer.

In the above-described method for fabricating a semiconductor device, it is possible that, in the step of forming the first diffusion layer and the second diffusion layer, the dopant is ion implanted at a prescribed angle to a normal to the semiconductor substrate to form a prescribed offset between the gate electrode and the first diffusion layer.

In the above-described method for fabricating a semiconductor device, it is possible that, in the step of forming the first diffusion layer and the second diffusion layer, the second diffusion layer is formed outer of a vicinity of the edge of the gate electrode on one side of the gate electrode, and, on the other side of the gate electrode, the first diffusion layer with the prescribed offset from the edge of the gate electrode and the second diffusion layer are formed.

In the above-described method for fabricating a semiconductor device, it is possible that the method further comprises: the step of forming an electrode layer on the eave-shaped film, and in which a T-shaped gate electrode is formed of the gate electrode, the eave-shaped film and the electrode layer.

In the above-described method for fabricating a semiconductor device, it is possible that the method further comprises: the step of removing the eave-shaped film before the step of forming the mask film.

In the above-described method for fabricating a semiconductor device, it is possible that the step of forming the gate electrode and the eave-shaped film includes: the step of forming a conducting film to be the gate electrode on the semiconductor substrate; the step of forming on the conducting film an antireflection coating film for suppressing reflection in photolithography; the step of forming on the antireflection coating film a first resist film having a pattern of the gate electrode by photolithography; etching the antireflection coating film and the conducting film with the first resist film as a mask to form the gate electrode of the conducting film, and eave-shaped film formed of the antireflection coating film on the gate electrode and having a eave-shaped portion projected beyond the edge of the gate electrode.

In the above-described method for fabricating a semiconductor device, it is possible that the antireflection coating film is formed of a material soluble in a developer for developing the first resist film, so that the antireflection coating film is patterned simultaneously with the development of the first resist.

In the above-described method for fabricating a semiconductor device, it is possible that the step of forming the first diffusion layer and a second diffusion layer includes: the step of forming a second resist film on the semiconductor substrate with the gate electrode and the eave-shaped film formed on; the step of forming a third resist film on the second resist film; the step of patterning the third resist film by photolithography; the step of etching the second resist film under conditions where the eave-shaped film is not to be removed, with the patterned third resist film as a mask; and the step of ion implanting a dopant with the second resist film, the third resist film and the gate electrode as a mask and with the eave-shaped portion of the eave-shaped film as a through film.

In the above-described method for fabricating a semiconductor device, it is possible that the antireflection coating film is etched with the first resist film as a mask, and the conducting film is etched with the patterned antireflection coating film as a mask.

DETAILED DESCRIPTION OF THE INVENTION

[A First Embodiment]

The method for fabricating a semiconductor device according to a first embodiment of the present invention will be explained with reference to FIGS. 1A–1C, 2A–2C and 3A–3B.

FIGS. 1A–1C, 2A–2B and 3A–3B are sectional views of the semiconductor device according to the present embodiment in the steps of the method for fabricating the semiconductor device, which explain the method.

Figure 1A:
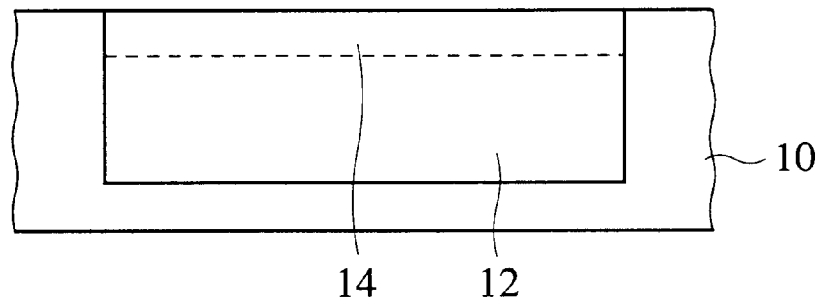
FIGS. 1A–1C are sectional views of the semiconductor device according to a first embodiment of the present invention in the steps of the method for fabricating the same, which show the method (Part 1).

First, magnesium (Mg) as an acceptor impurity and Si (silicon) as a donor impurity are ion-implanted in a MESFET region of a GaAs substrate 10 to form a buried P-layer 12 of the Mg doped layer and an n-channel layer 14 of an Si doped layer (FIG. 1A). In the ion implantation for forming the buried P-layer 12 Mg ions are implanted under conditions of, e.g., 120 keV acceleration energy and a $3.0 \times 10^{12}$ $cm^{-2}$ dose. In the ion implantation for forming the n-channel layer 14 Si ions are implanted under conditions of, e.g., 10 keV acceleration energy and a $2 \times 10^{13}$ $cm^{-2}$ dose.

Then, a WSi (tungsten silicide) film 16 is deposited on the entire surface by, e.g., sputtering method. The WSi film 16 is to be a gate electrode.

Figure 1B:
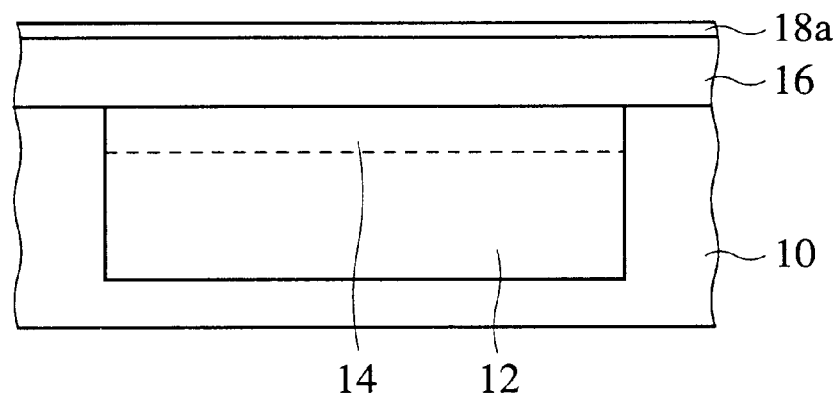

Then, an SiN (silicon nitride) film is deposited on the WSi film 16 by, e.g., plasma CVD method. Thus, an antireflection coating film 18a of the SiN film is formed (FIG. 1B).

The antireflection coating film 18a has a thickness which is selected so that a minimum reflectivity can be obtained for an exposure wavelength of an exposer system used in patterning the WSi film 16. For example, in a case that the antireflection coating film 18a is an SiN film, a reflectivity can be about 30 nm for i-line exposure and about 45 nm for g-line exposure. The relationship between the reflectivity and the antireflection coating film thickness is periodic, and it is preferable that a suitable film thickness and a film material are selected in accordance with conditions for ion implantation in later steps.

It is preferable that the antireflection coating film is formed of a material which can yield a low reflectivity for an exposure wavelength of the exposure system, and an inorganic material having film thickness controllability of which is good is used.

Figure 1C:
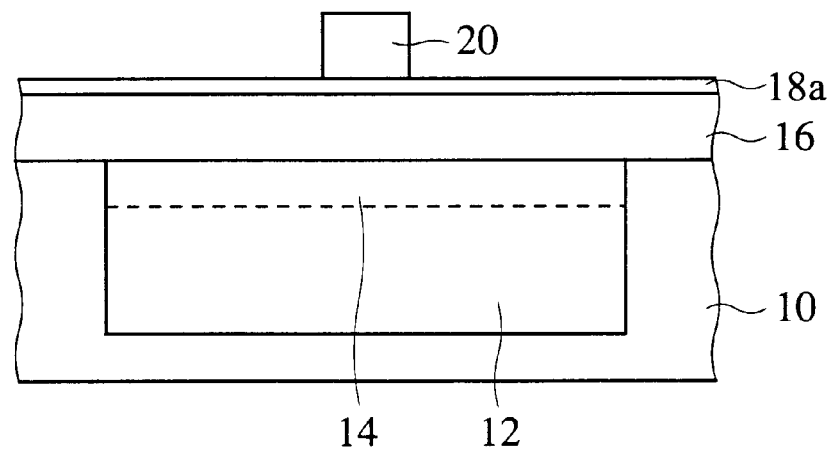

Then, a resist 20 for patterning the gate electrode is formed on the antireflection coating film by the usual lithography techniques (FIG. 1C). At this time, the antireflection coating film 18a decreases halation, whereby intraplane uniformity of the resist 20 can be high.

Figure 2A:
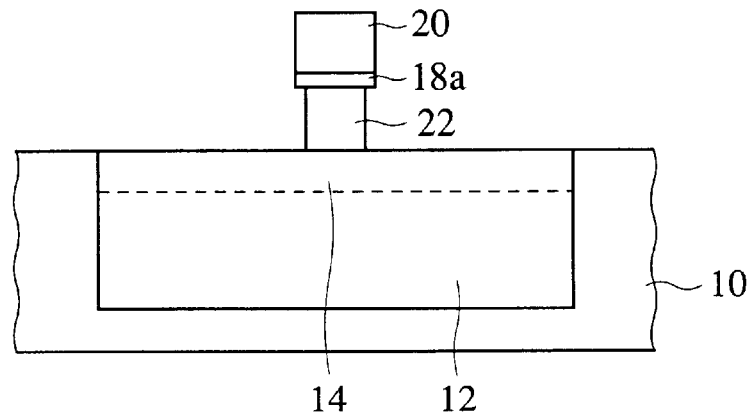
FIGS. 2A–2C are sectional views of the semiconductor device according to the first embodiment of the present invention in the steps of the method for fabricating the same, which show the method (Part 2).

Next, the antireflection coating film 18a and the WSi film 16 are patterned with the resist 20 as a mask to form the gate electrode 22 having the upper surface covered with the antireflection coating film 18a and formed of the WSi film 16 is formed (FIG. 2A).

At this time, the antireflection coating film 18a and the WSi film 16 are etched under conditions for forming the eave-shaped structure in which the antireflection coating film 18a on the gate electrode 22 is projected beyond the edge of the gate electrode 22. The WSi film 16 is patterned, forming the eave-shaped structure by etching the SiN film and the WSi film by ECR plasma etching using, e.g., a mixed gas of $SF_6$ gas and $CHF_3$ gas. A mixing ratio of $SF_6$ gas and $CHF_3$ gas is adjusted to be about 1:4~1:5, whereby the WSi film 16 is side-etched while the SiN film is less side-etched immediately below the resist 20.

Then, after the resist 20 is removed, a resist 24 for covering the region other than the MESFET region is formed by the usual lithography techniques.

Next, Si ions are implanted with the resist 24 and the gate electrode 22 as a mask and the antireflection coating film 18a as a through film to form an impurity diffusion layer in the GaAs substrate 10. At this time, those of the ions implanted through the antireflection coating film 18a have acceleration energy reduced by the antireflection coating film 18a and in a smaller dose. Accordingly, the ions are implanted in the GaAs substrate 10 immediately below the antireflection coating film under conditions of acceleration energy and a dose which are substantially lower and smaller than those in the rest region.

Figure 2B:
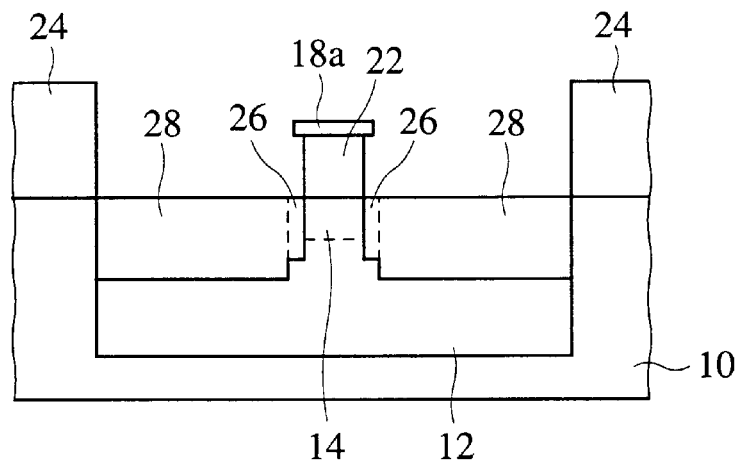

Thus, a shallow and lightly doped n"-layer 26 near the edge of the gate electrode 22, and a deeper and more heavily doped n'-layer 28 than the n"-layer 26 are concurrently formed (FIG. 2B).

For example, in a case that the antireflection coating film 18a is formed of an 30 nm-thick SiN film for the i-line exposure, the Si ion implantation is performed under 30 keV acceleration energy and a $6\times10^{13}$ $cm^{-2}$ dose, whereby the n"-layer 26 can have a depth corresponding to the 20 keV acceleration energy.

In this specification the through film means a film through which ions are implanted into a ground layer. The ion implantation through a through film has the effect of substantially reducing acceleration energy and a dose of the implanted ions in a region through the through film in comparison with those of the rest region.

Figure 2C:
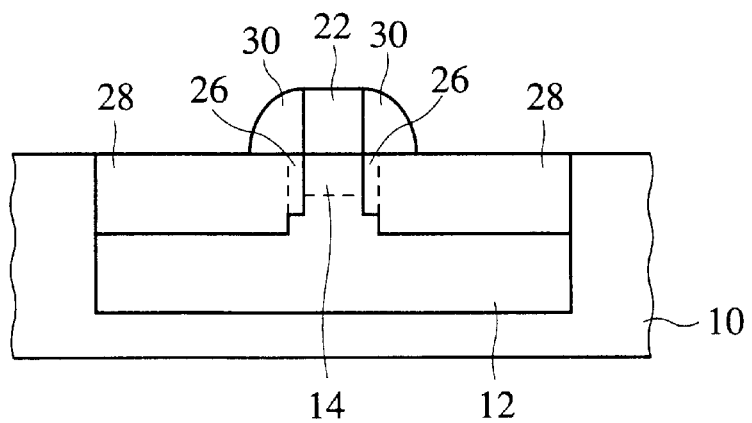

Then, after the resist 24 and the antireflection coating film 18a are removed, an insulation film is deposited on the entire surface and etched back to form a sidewall insulation film 30 having a wider width than the antireflection coating film 18a (FIG. 2C). The antireflection coating film can be removed by wet treatment with a hydrofluoric acid-based aqueous solution.

Next, a resist 32 for covering the region other than the MESFET region is formed by the usual lithography techniques.

Figure 3A:
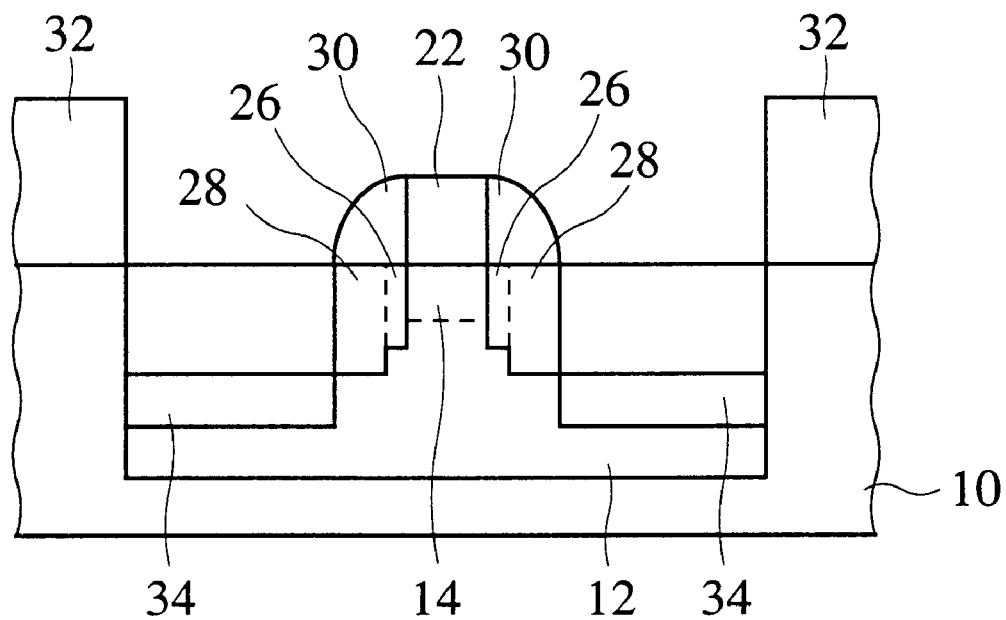
FIGS. 3A–3B are sectional views of the semiconductor device according to the first embodiment of the present invention in the steps of the method for fabricating the same, which show the method (Part 3).

Then, Si ions are implanted with the resist 32, the gate electrode 22 and the sidewall insulation film 30 as a mask to form an $n^+$-layer 34 (FIG. 3A). In the ion implantation for forming the $n^+$-layer 34 Si ions are implanted under conditions of, e.g., 90 keV acceleration energy and a $5.0\times10^{13}$ $cm^{-2}$ dose.

Next, after the resist 32 and the sidewall insulation film 30 are removed, a heat treatment is performed to activate the implanted dopant.

Figure 3B:
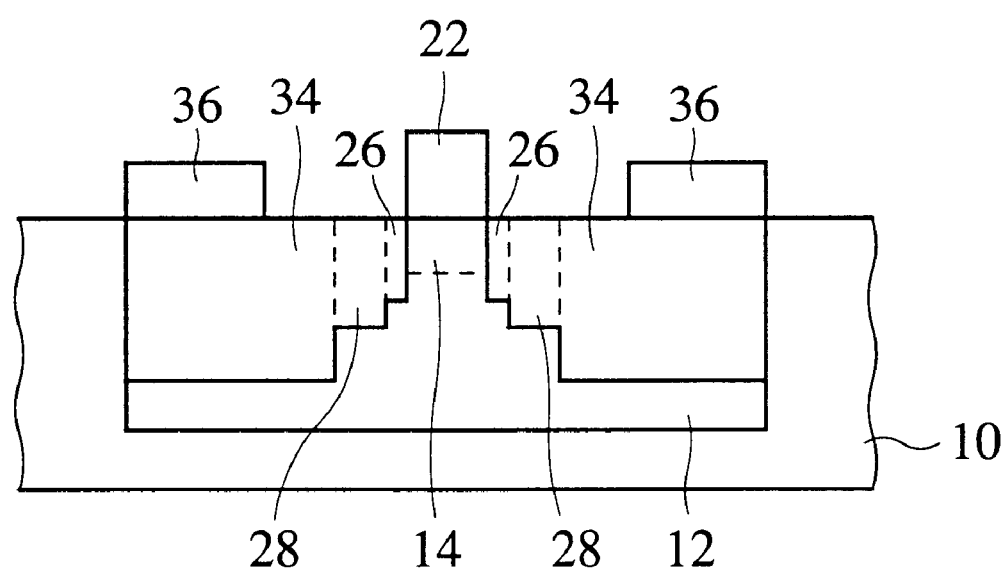

Next, an ohmic electrode 36 is formed on the $n^+$-layer 34, and a MESFET is completed (FIG. 3B).

Thus, a MESFET of the developed BP-LDD structure having the source/drain diffusion layer formed of the n"-layer 26, the n'-layer 28 and $n^+$-layer 34 can be fabricated.

A MESFET of the developed BP-LDD structure fabricated by the above-described semiconductor device fabrication method could have a 0.2 μm gate length and a 70 GHz shutdown frequency $f_t$.

As described above, according to the present embodiment, the n"-layer 26 and the n'-layer 28 are formed with the use of the eave-shaped structure formed of the antireflection coating film 18a, so that a MESFET of the developed BP-LDD structure can be formed without extra steps of implanting ions and forming masks.

The material of the antireflection coating film 18a has so good film thickness controllability that the horizontal portion of high precision can be formed in comparison with the conventional semiconductor device fabrication process using a resist. Accordingly, the n"-layer 26 formed by ion implantation through the eave-shaped structure can be formed without fluctuation and with good reproducibility.

The n"-layer 26 and the n'-layer 28 can be formed by once ion implantation, so that a carrier concentration of the surface of the substrate can be suppressed to a required minimum. As a result, an improved breakdown voltage of the Schottky junction of the gate can be obtained.

In the present embodiment, a material of the gate electrode 22 is WSi film but is not essential. For example, WSiN film or WN film can be used. The antireflection coating film 18a may be formed of SiON film other than SiN film.

The etching gas for etching the antireflection coating film 18a and the WSi film 16 may additionally contain $CF_4$ gas.

In the present embodiment the antireflection coating film 18a and the WSi film 16 are etched simultaneously but may be etched separately.

[A Second Embodiment]

The method for fabricating a semiconductor device according to a second embodiment of the present invention will be explained with reference to FIGS. 4A–4C, 5A–5C and 6A–6C. The same members of the present embodiment as those of the method for fabricating the semiconductor device according to the first embodiment are represented by the same reference numbers not to repeat or to simplify their explanation.

FIGS. 4A–4C, 5A–5C, and 6A–6C are sectional views of the semiconductor device according to the present embodiment in the steps of the method for fabricating the semiconductor device, which-explain the method.

Figure 4A:
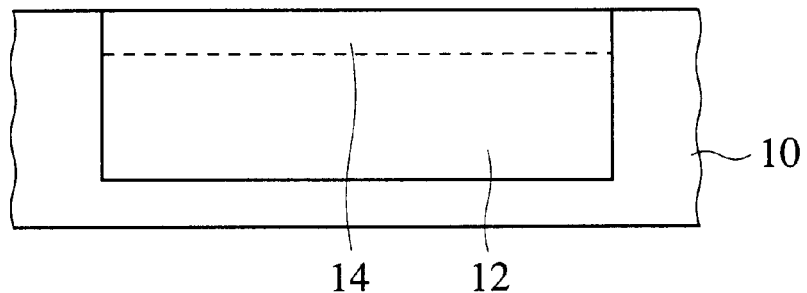
FIGS. 4A–4C are sectional views of the semiconductor device according to a second embodiment of the present invention in the steps of the method for fabricating the same, which show the method (Part 1).

First, a buried P-layer 12 and an n-channel layer 14 are formed on a GaAs substrate 10 in the same way as in the method for fabricating a semiconductor device according to the first embodiment exemplified in FIG. 1A (FIG. 4A).

Then, a WSi film 16 is deposited on the entire surface by, e.g., sputtering method. WSi film 16 is to be a gate electrode.

Figure 4B:
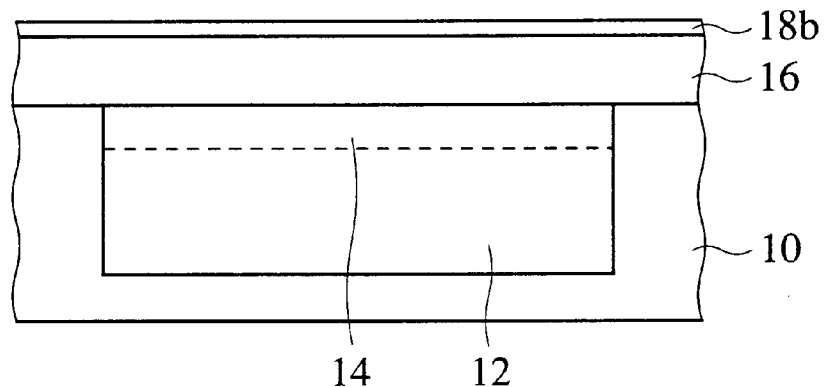

Next, an AlN (aluminum nitride) film is deposited on the WSi film 16 by, e.g, sputtering method. Thus, an antireflection coating film 18b of the AlN film is formed (FIG. 4B).

Figure 4C:
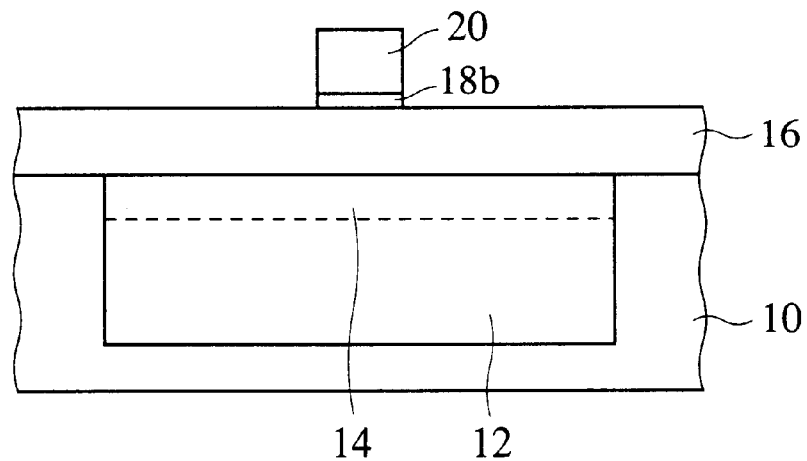

Then, a resist 20 for patterning the gate electrode is formed on the antireflection coating film 18b by the usual lithography techniques. At this time, a developer containing TMAH (tetramethyl ammonium hydride) is used as a developer for developing the resist 20, and because AlN film is soluble to TMAH, the antireflection coating film 18b of the AlN film is etched concurrently with the development of the resist 20 (FIG. 4C).

Figure 5A:
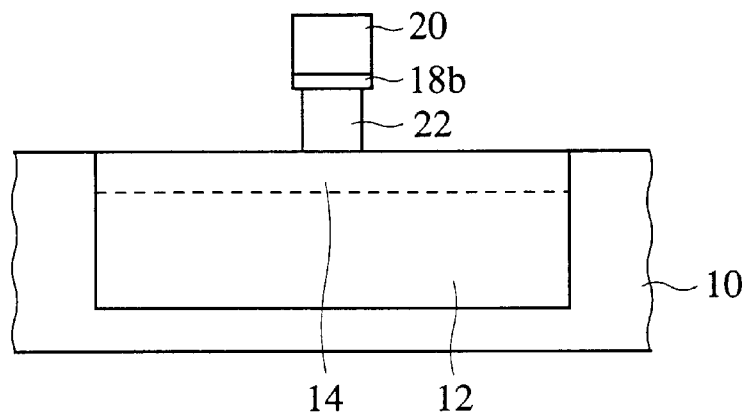
FIGS. 5A–5C are sectional views of the semiconductor device according to the second embodiment of the present invention in the steps of the method for fabricating the same, which show the method (Part 2).

Then, the WSi film 16 is patterned with the resist 20 as a mask to form the gate electrode 22 of the WSi film 16 with the upper surface covered with the antireflection coating film 18b (FIG. 5A). At this time, in the same way as in the semiconductor fabricating method according to the first embodiment, the antireflection coating film 18b and the WSi film 16 are etched under conditions for the antireflection coating film 18b on the gate electrode 22 is extended beyond the edge of the gate electrode 22 to form the eave-shaped structure of the antireflection coating film 18b. The antireflection coating film of AlN is not etched by the etchant gas for etching the WSi film, so that the eave-shaped structure can be easily formed by controlling the etching condition of the WSi film.

Then, a resist 24 for covering the region other than a MESFET region by the usual lithography techniques.

At this time, if the resist 24 is formed by the use of a developer containing the usual TMAH, the antireflection coating film 18b of the AlN film forming the eave-shaped structure is solved concurrently with the development of the resist 24. So, the resist 24 is formed by, e.g., double-layer resist while the antireflection coating film 18b is being left.

Figure 5B:
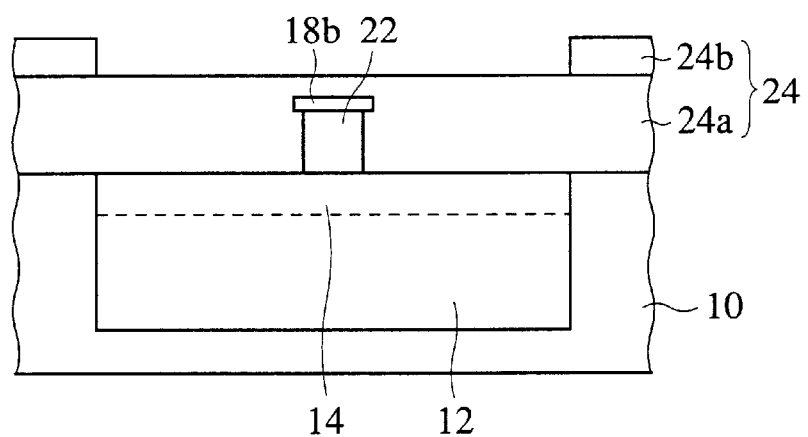
Figure 5C:
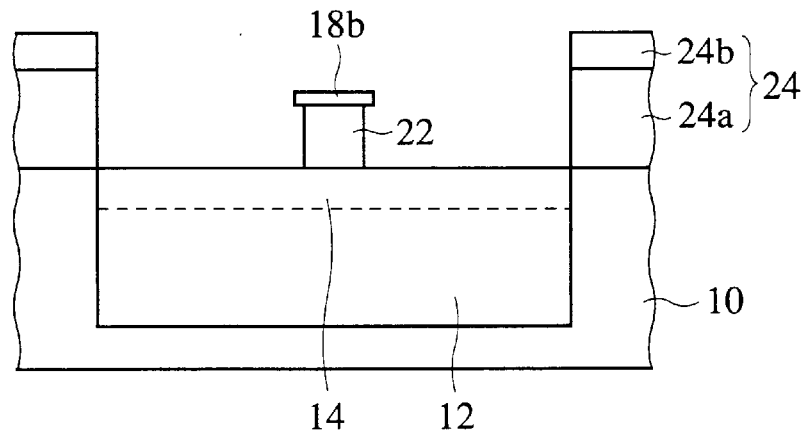

For example, first, the first resist 24a is applied in a thickness which completely covers the gate electrode 22. Then, a heat treatment is performed at, e.g., 200° C. for 5 minutes so that the first resist will not be removed when the second resist 24b is developed in a later step. Then, the second resist 24b is applied, and the second resist 24b alone is patterned by the usual exposure and development (FIG. 5B). Next, the pattern of the second resist 24b is transferred to the first resist 24a by, e.g., dry etching using $O_2$ gas (FIG. 5C). Thus the resist 24 can be formed while the antireflection coating film 18b is being left.

Figure 6A:
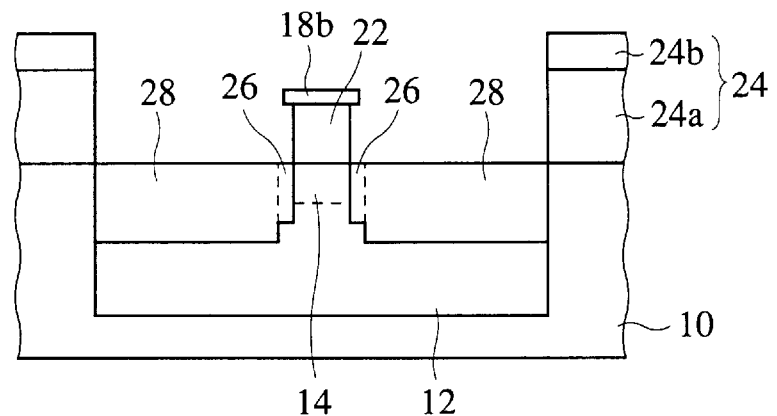
FIGS. 6A–6C are sectional views of the semiconductor device according to the second embodiment of the present invention in the steps of the method for fabricating the same, which show the method (Part 3).
Figure 6B:
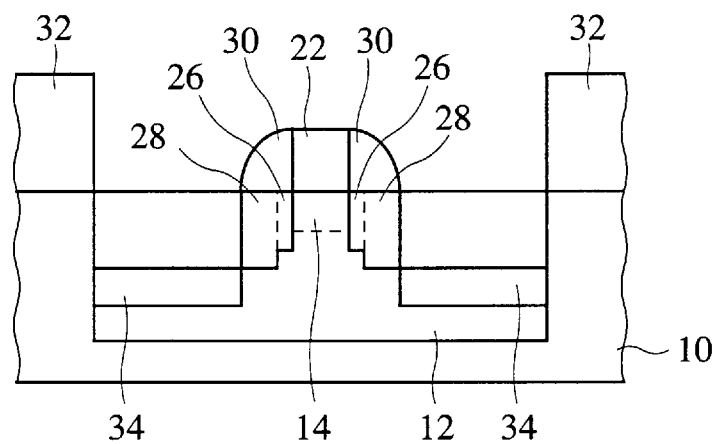
Figure 6C:
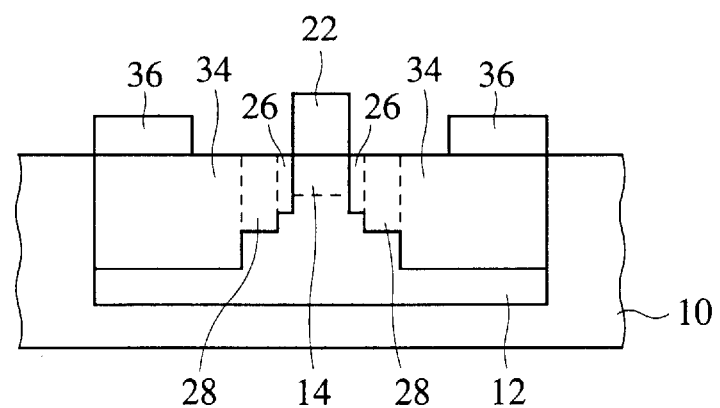

Then, in the same way as in, e.g., the semiconductor device fabrication method according to the first embodiment a MESFET of the developed BP-LDD structure including the source/drain diffusion layer formed of an n"-layer 26, an n'-layer and an $n^+$-layer 34 is fabricated (FIGS. 6A–6C).

As described above, according to the present embodiment, the n"-layer 26 and the n'-layer 28 are formed by the use of the eave-shaped structure, which is formed of the antireflection coating film 18b, whereby a MESFET of the developed BP-LDD structure can be formed without additionally including the steps of ion implantation for forming a device isolation region and forming masks.

In the present embodiment, a material of the gate electrode 22 is WSi film but is not essentially limited to WSi film. For example, WSiN film, WN film or others may be used. Differently from the first embodiment, even TiW film, TiWN film or others having low etching rates with respect to hydrofluoric acid-based etching gases, such as $SF_6$ can ensure sufficient selective ratios with respect to the AlN film, and are applicable as a film forming the gate electrode 22.

The antireflection coating film 18b can be removed by wet treatment using phosphoric acid other than a developer containing TMAH.

[A Third Embodiment]

The semiconductor device according to a third embodiment of the present invention and the method for fabricating the same will be explained with reference to FIGS. 7, 8A–8C and 9A–9B. The same members of the present embodiment as those of the semiconductor device fabrication method according to the first and the second embodiments are represented by the same reference numbers not to repeat or to simplify their explanation.

Figure 7:
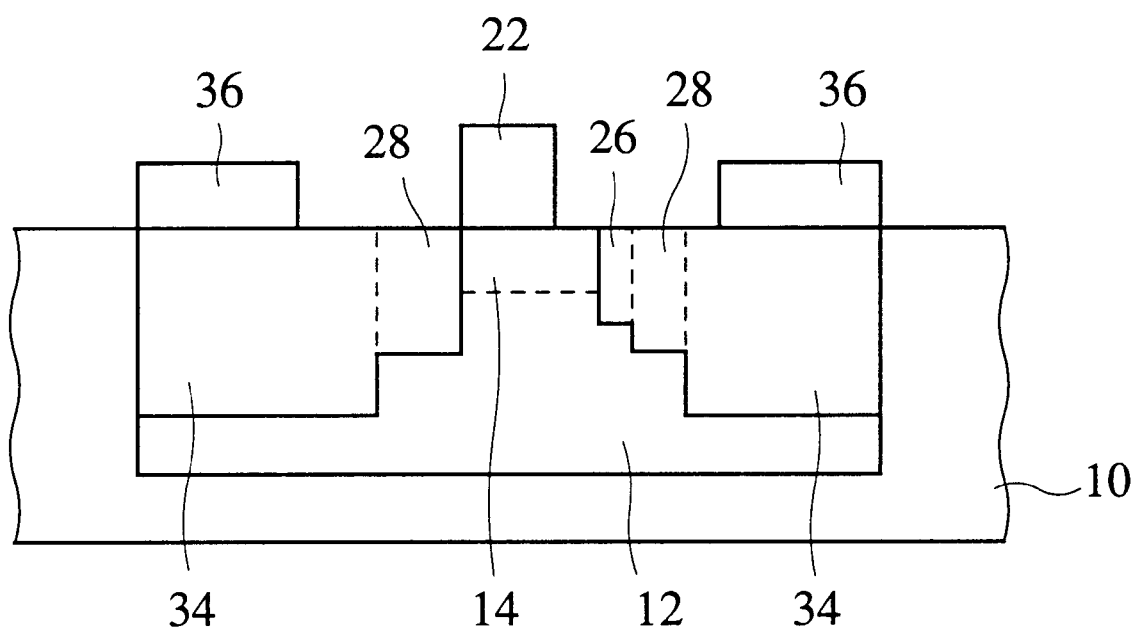
FIG. 7 is a diagrammatic sectional view of the semiconductor device according to a third embodiment of the present invention, which shows a structure thereof.

FIG. 7 is a diagrammatic sectional view of the semiconductor device according to the present embodiment, which shows a structure thereof. FIGS. 8A–8C and 9A–9B are sectional views of the semiconductor device according to the present embodiment in the steps of the method for fabricating the same, which show the method.

First, the structure of the semiconductor device according to the present embodiment will be explained with reference to FIG. 7.

A buried P-layer 12 and a channel layer 14 are formed in a GaAs substrate 10. A gate electrode 22 is formed on the GaAs substrate 10 with the buried P-layer 12 and the channel layer 14 formed on. On the GaAs substrate 10 on both sides of the gate electrode 22 there are formed dopant diffusion layers forming a source/drain diffusion layer.

The dopant diffusion layer on the right side as viewed in the drawing, which corresponds to the drain diffusion layer is formed of an n"-layer 26 which is formed with a prescribed offset from the edge of the gate electrode 22; an n'-layer 28 which is formed in a region outer of the n"-layer 26, has a higher dopant concentration and is deeper than the n"-layer 26, and an $n^+$-layer 34 which is formed in a region outer of the n'-layer 28, has a higher dopant concentration and is deeper than the n'-layer 28.

The dopant layer on the left side as viewed in the drawing, which corresponds to the source diffusion layer is formed of the n'-layer 28 which is formed near the edge of the gate electrode and outward of the gate electrode and an $n^+$-layer 34 which is formed in a region outer of the n'-layer 28, has a higher dopant concentration and is deeper than the n'-layer 28.

As described above, the semiconductor device according to the present embodiment is characterized in that a MESFET of the developed BP-LDD structure in which an offset is provided in the dopant diffusion layer on the side of the drain, and in that the n"-layer 26 is not formed in the dopant diffusion layer on the side of the source. The semiconductor device having such structure can have improved breakdown voltage at the Schottky junction without resistance increase between the source and the drain.

That is, in the semiconductor device according to the present embodiment, the offset for improving breakdown voltage at the Schottky junction is provided only on the side of the drain. In comparison with the conventional semiconductor device shown in FIG. 18 in which an offset is provided on both sides, a substantially shorter channel length can be obtained. Accordingly, the resistance increase between the source and the drain can be depressed.

Figure 18:
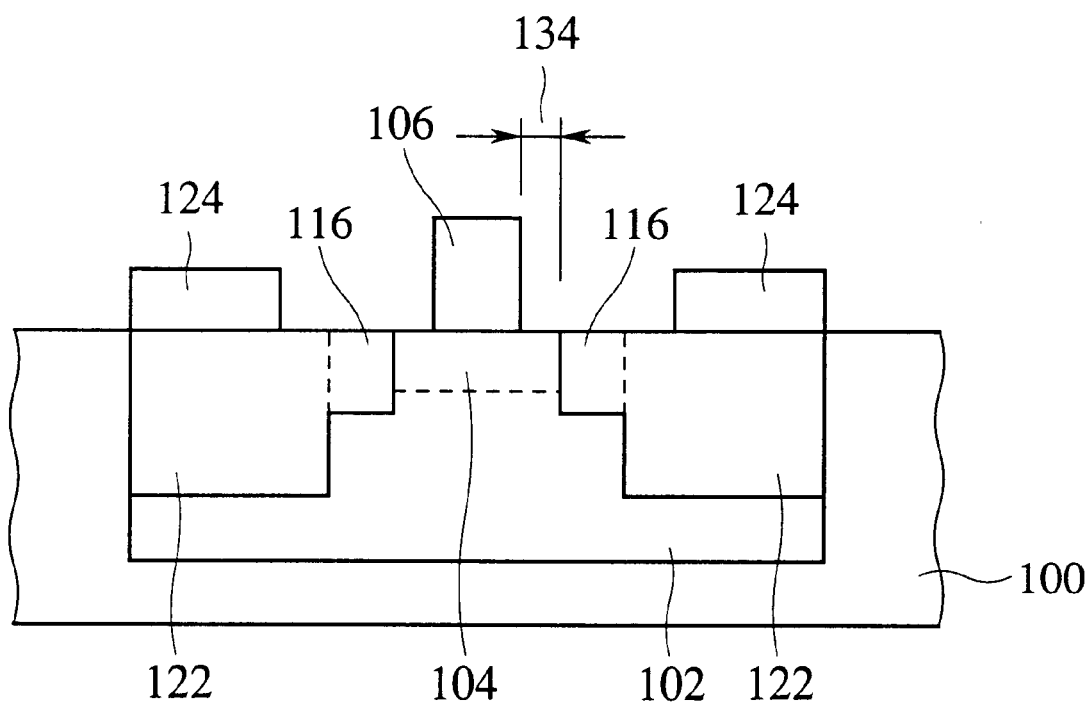
FIG. 18 is a diagrammatic sectional view of a third conventional semiconductor device.

Because of the dopant diffusion layer on the side of the drain, which is formed of the n"-layer 26, the n'-layer 28 and the $n^+$-layer 34, the short channel effect can be more effectively depressed in comparison with the conventional semiconductor device shown in FIG. 18.

The semiconductor device according to the present embodiment can be fabricated by the following fabrication process without drastically increasing fabrication steps.

Next, the method for fabricating the semiconductor device according to the present embodiment will be explained with reference to FIGS. 8A–8C and 9A–9B.

Figure 8A:
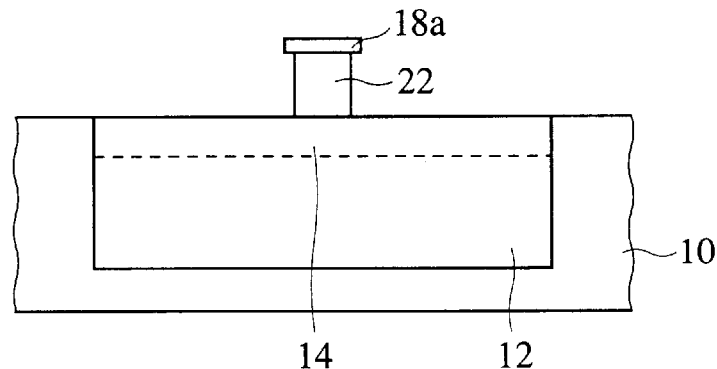
FIGS. 8A–8C are sectional views of the semiconductor device according to the third embodiment of the present invention in the steps of the method for fabricating the same, which show the method (Part 1).

In the same way as in the semiconductor device fabrication method according to the first embodiment shown in FIGS. 1A–2A, the antireflection coating film 18a having the eave-shaped structure formed on the gate electrode 22 is formed (FIG. 8A). In the present embodiment, a width of the antireflection coating film 18a is 0.6 μm, and a width of the eave-shaped portion on each side is 0.2 μm.

Then, a resist 24 for covering the region other than the MESFET region is formed by the usual lithography techniques.

Next, with the resist 24 and the gate electrode 22 as a mask, and the antireflection coating film 18a as a through film, Si ions are implanted to form a dopant diffusion layer in the GaAs substrate 10.

At this time, an incident direction of the Si ions is inclined toward the side of the source by, e.g., about 30° to the normal direction of the GaAs substrate 10 to form an offset with respect to the dopant diffusion layer to be formed on the side of the drain. A thickness of the gate electrode 22 is set to be 0.4 μm, and a length of the offset on the side of the drain becomes about 0.2 μm.

Figure 8B:
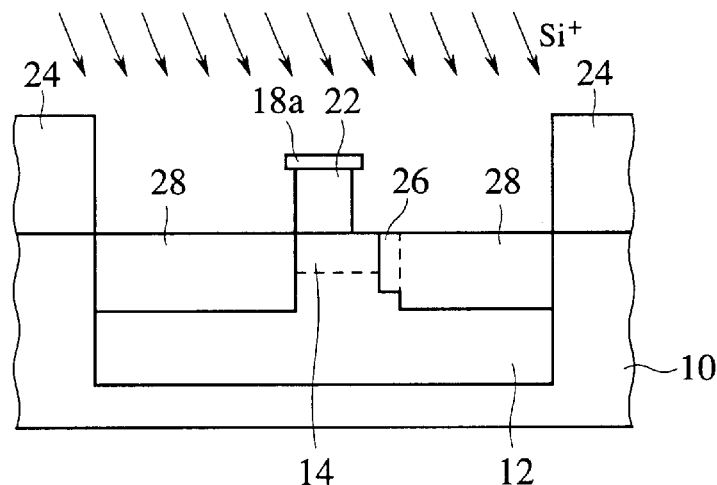

Because of the eave-shaped structure of the antireflection coating film 18a on the gate electrode 22, the n"-layer 26 of a 0.2 μm width is formed with the 0.2 μm-offset with respect to the edge of the gate electrode 22, and the n'-layer 28 is formed outer of the n"-layer 26. On the other hand, the n'-layer 28 alone is formed on the side of the source (FIG. 8B).

Figure 8C:
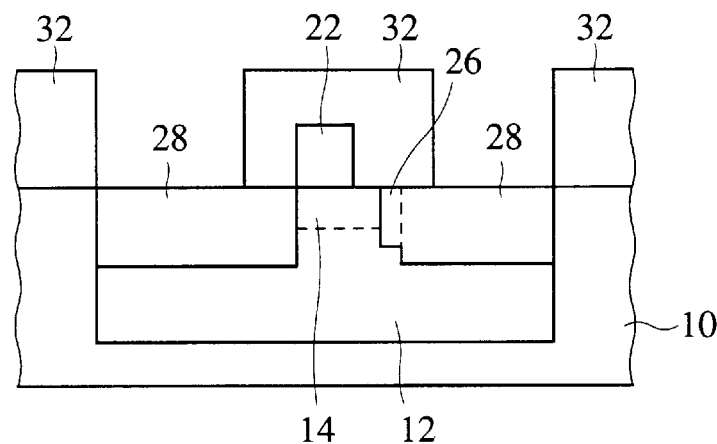

Then, after the antireflection coating film 18a is removed, a resist 32 for covering a peripheral part of the gate electrode 22 and the region other than the MESFET region is formed by the usual lithography techniques (FIG. 8C).

Figure 9A:
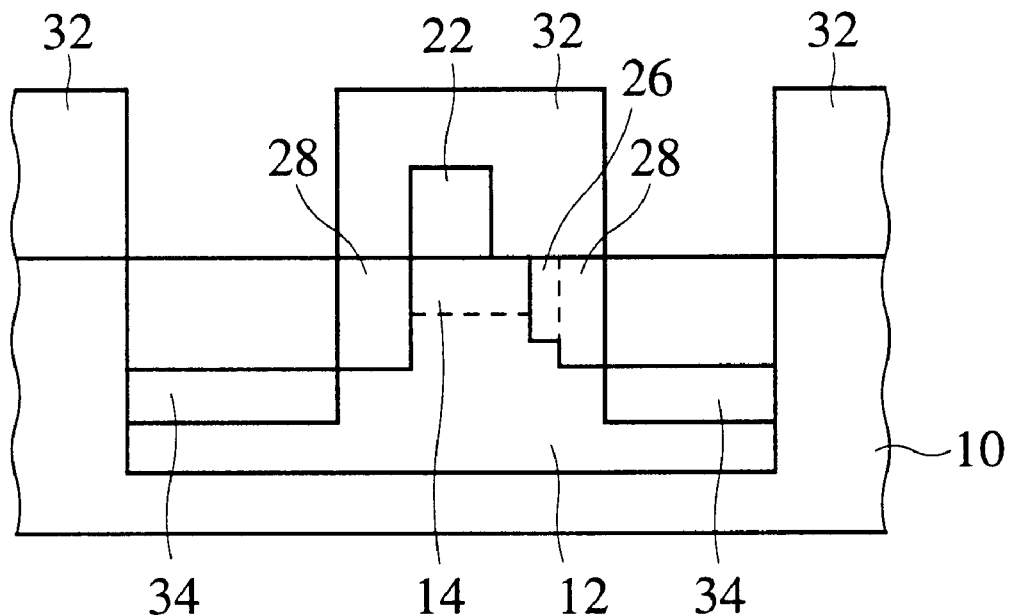
FIGS. 9A–9B are sectional views of the semiconductor device according to the third embodiment of the present invention in the steps of the method for fabricating the same, which show the method (Part 2).

Next, with the resist 32 as a mask Si ions are implanted to form the n+-layer 34 (FIG. 9A).

Next, after the resist 32 is removed, a heat treatment is performed to activate the dopant.

Figure 9B:
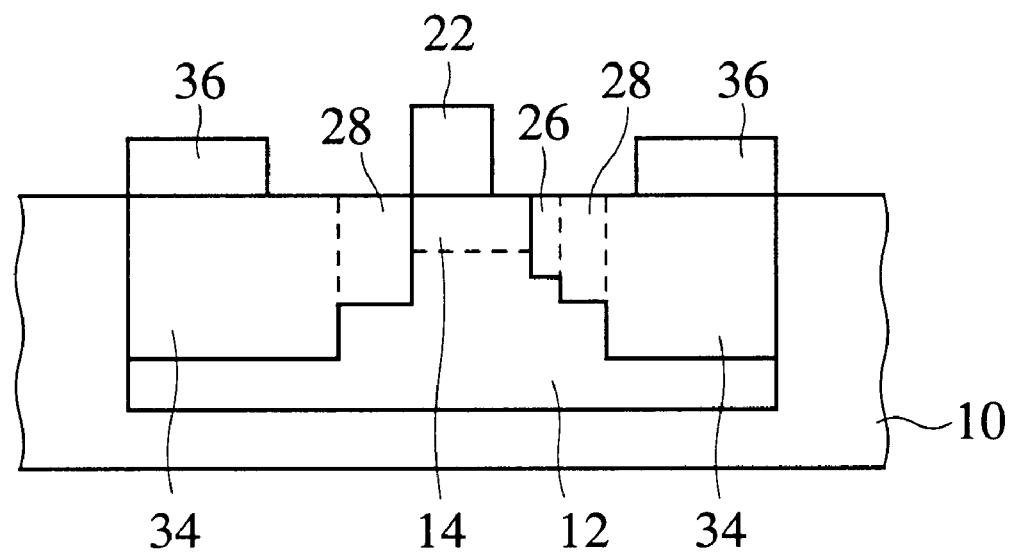

Then, in the same way as in, e.g., the semiconductor device fabrication method according to the first embodiment shown in FIG. 3B, the ohmic electrode 36 is formed on the n+-layer 34 (FIG. 9B).

Thus, a MESFET of the developed BP-LDD structure having the source/drain diffusion layer formed of the n"-layer 26, the n'-layer 28 and the n+-layer 34 and having the offset formed on the side of the drain is formed.

As described above, according to the present embodiment, in the method for fabricating a MESFET of the developed BP-LDD structure, the offset is formed in the diffusion layer only on the side of the drain by using the inclined ion implantation, so that improved breakdown voltage at the Schottky junction can be obtained without increasing source-drain resistance.

In the present embodiment, the diffusion layer structure having the offset is applied to the method for fabricating the semiconductor device according to the first embodiment but is applicable also to the method for fabricating the semiconductor device according to the second embodiment.

[A Fourth Embodiment]

The semiconductor device according to a fourth embodiment of the present invention and the method for fabricating the same will be explained with reference to FIGS. 10, 11A–11C, 12A–12C and 13A–13C. The same member of the present embodiment as those of the method for fabricating the semiconductor device according to the first and the second embodiments are represented by the same reference numbers not to repeat or to simplify their explanation.

Figure 10:
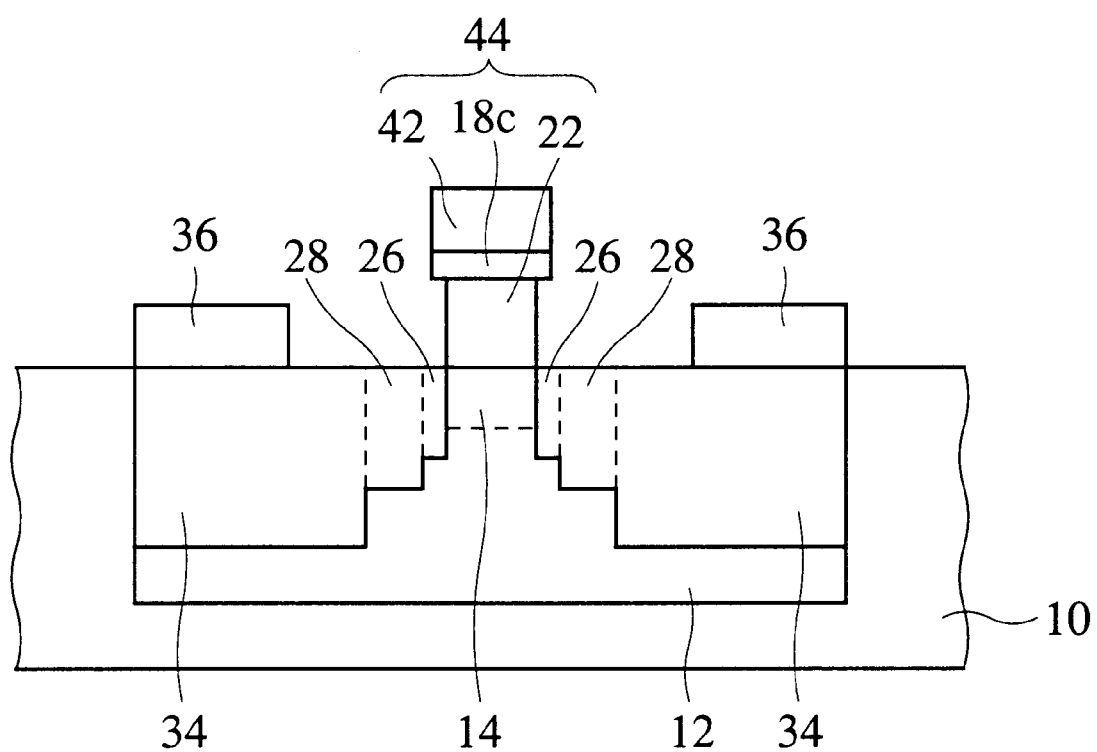
FIG. 10 is a diagrammatic sectional view of the semiconductor device according to a fourth embodiment of the present invention, which shows a structure thereof.

FIG. 10 is a diagrammatic sectional view of the semiconductor device according to the present embodiment, which shows a structure thereof. FIGS. 11A–11C, 12A–12C, and 13A–13C are sectional views of the semiconductor device according to the present embodiment in the steps of the method for fabricating the same, which show the method.

First, the structure of the semiconductor device according to the present embodiment will be explained with reference to FIG. 10.

As shown in FIG. 10, the semiconductor device according to the present embodiment is characterized in that a MESFET of the developed BP-LDD structure having the source/drain diffusion layer formed of an n"-layer 26, an n'-layer 28 and an n+-layer 34 includes a T-shaped gate electrode 44 formed of a gate electrode 22 contacting a GaAs substrate 10, an antireflection coating film 18c having an eave-shaped structure, and an Au electrode 42 formed on the antireflection coating film 18c.

The semiconductor device has such structure, whereby a merit of the T-shaped gate structure that gate resistance increase accompanying channel length decrease can be obtained, and RF characteristics of the MESFET can be made uniform.

Then, the method for fabricating the semiconductor device according to the present embodiment will be explained with reference to FIGS. 11A–11C, 12A–12C, and 13A–13C.

Figure 11A:
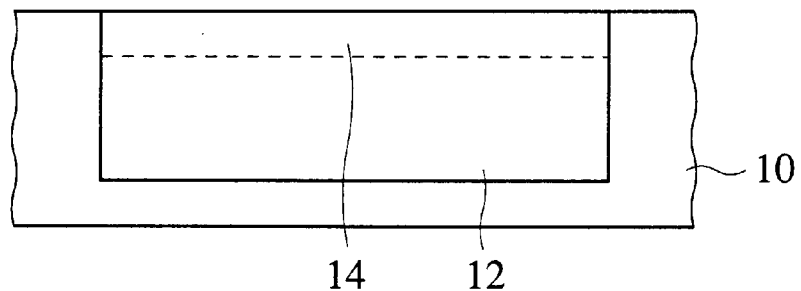
FIGS. 11A–11C are sectional views of the semiconductor device according to the fourth embodiment of the present invention in the steps of the method for fabricating the same, which show the method (Part 1).

First, in the same was as in, e.g., the semiconductor fabrication method according to the first embodiment shown in FIG. 1A, a buried P-layer 12 and an n-channel layer 14 are formed in the GaAs substrate 10 (FIG. 11A).

Then, an about 400 nm-thick WSi film 16 is deposited on the entire surface by, e.g., sputtering method. The WSi film 16 is to be the gate electrode.

Figure 11B:
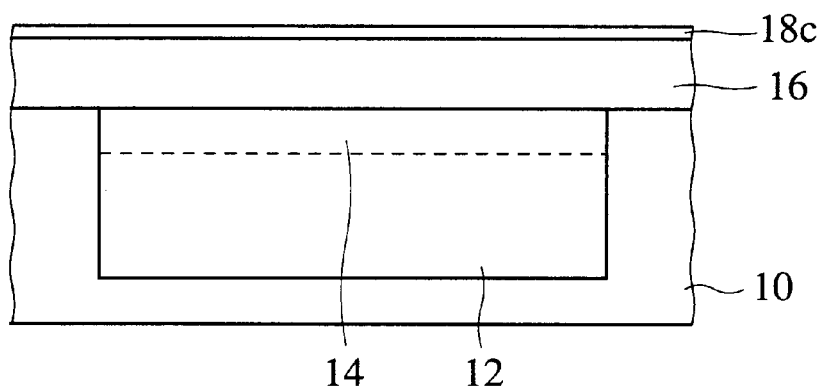

Next, a TiN (titanium nitride) film is deposited on the WSi film 16 by, e.g., sputtering method. Thus, the antireflection coating film 18c of the TiN film is formed (FIG. 11B). The TiN film, which is a metal material, can have a film thickness optionally set, differently from transparent films, such as SiN film, AlN film, etc.

Figure 11C:
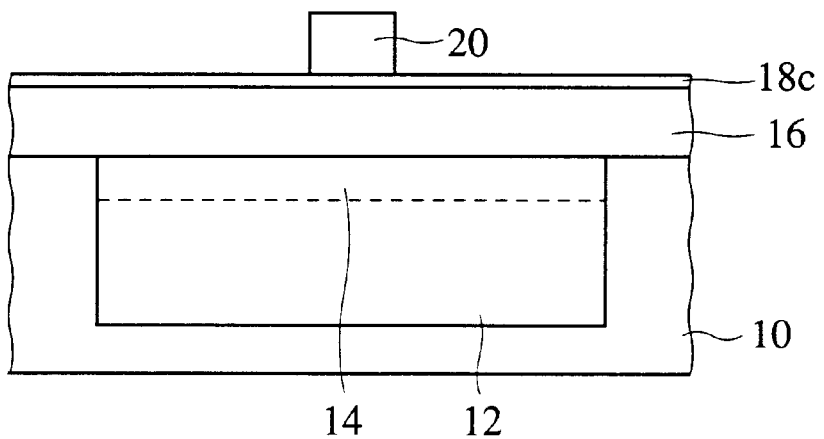

Then, a resist 20 for patterning the gate electrode is formed on the antireflection coating film 18c by the usual lithography techniques (FIG. 11C).

Next, with the resist 20 as a mask the antireflection coating film 18c of the TiN film is patterned. The antireflection coating film 18c is etched by, e.g., dry etching using a mixed gas of $Cl_2$ and $BCl_3$.

Figure 12A:
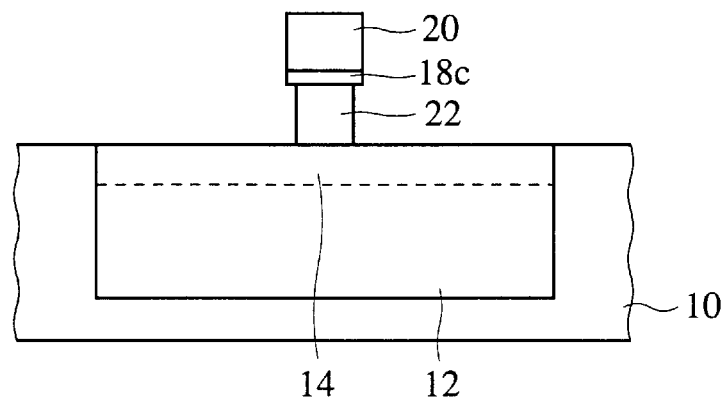
FIGS. 12A–12C are sectional views of the semiconductor device according to the fourth embodiment of the present invention in the steps of the method for fabricating the same, which show the method (Part 2).

Next, with the resist 20 as a mask the WSi film 16 is patterned to form the gate electrode 22 having the upper surface covered with the antireflection coating film 18c and formed of the WSi film 16 (FIG. 12A). At this time, in the same way as in the semiconductor device fabrication process according to the first embodiment, the WSi film 16 is etched under conditions where the antireflection coating film 18c on the gate electrode 22 is projected beyond the edge of the gate electrode 22, i.e, the eave-shaped structure is formed. For example, a mixed gas of $SF_6$ gas and $CHF_3$ gas can be used in etching the WSi film 16.

The etching gas for the etching of the TiN film and that for the etching of the WSi film 16 are different from each other. This is because TiN film cannot be etched with fluorine-based gases, and not only WSi but also GaAs is etched with chlorine-based gases, which makes it difficult to stop the etching on the GaAs substrate 10. TiN film is not etched with fluorine-based etching gases, which makes it easy to form the eave-shaped structure.

It is possible that after the antireflection coating film 18c is etched with the resist 20 as a mask the WSi film 16 is etched with the antireflection coating film 18c as a mask.

Figure 12B:
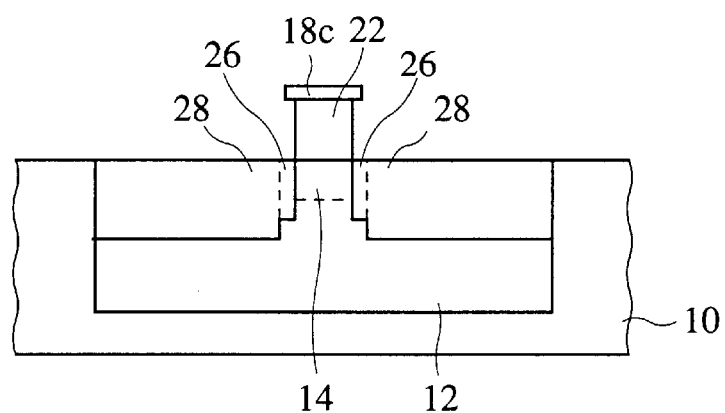

Then, afer the resist 20 is removed, the n"-layer 26 and an n'-layer 28 are formed in the same way as in, e.g., the semiconductor device fabrication method according to the first embodiment shown in FIGS. 2B and 2C (FIG. 12B).

Next, with the antireflection coating film 18c left, a resist 32 for covering a peripheral part of the gate electrode 22 and the region other than the MESFET region is formed by the usual lithography techniques.

Figure 12C:
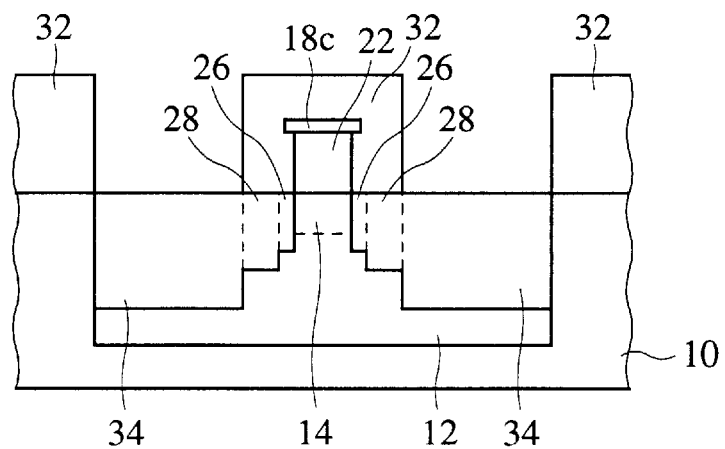

Then, with the resist 32 as a mask Si ions are implanted to form an n$^+$-layer 34 (FIG. 12C).

Next, a heat treatment is performed to activate the dopant. For example, the dopant is activated by lamp annealing in a nitrogen atmosphere, at 860° C. and for 10 seconds. The heat treatment never affects the antireflection coating film 18c because the antireflection coating film 18c is formed of TiN film, which is a refractory metal and is used as a barrier metal.

Figure 13A:
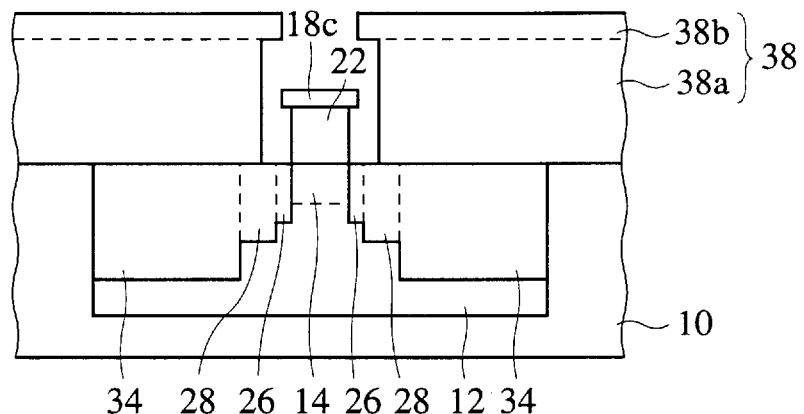
FIGS. 13A–13C are sectional views of the semiconductor device according to the fourth embodiment of the present invention in the steps of the method for fabricating the same, which show the method (Part 3).

Next, a resist 38a of a higher sensitivity and a resist 38b of a lower sensitivity are sequentially applied to the entire surface and are exposed and developed under conditions where the resist 38b is patterned to be trimmed by a width substantially equal to that of the antireflection coating film 18c. Thus is formed a resist 38 having a wider opening on the side of the substrate and having in the surface an opening of a width substantially equal to the width of the antireflection coating film 18c (FIG. 13A).

Figure 13B:
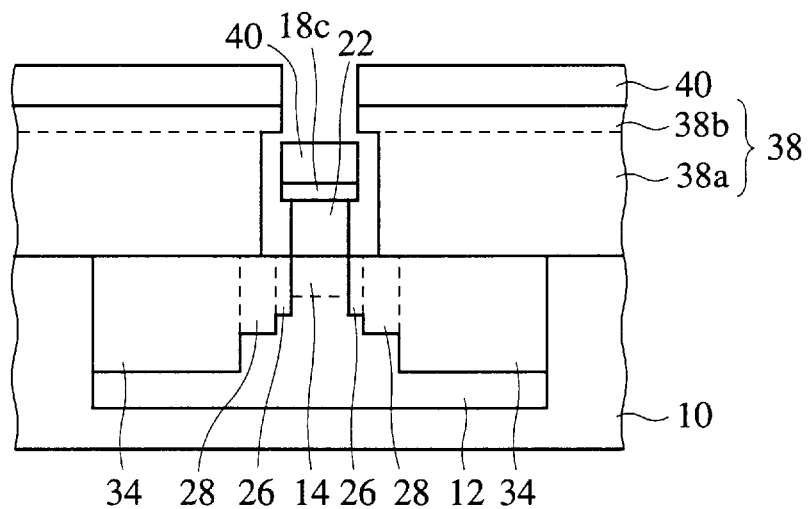
Figure 13C:
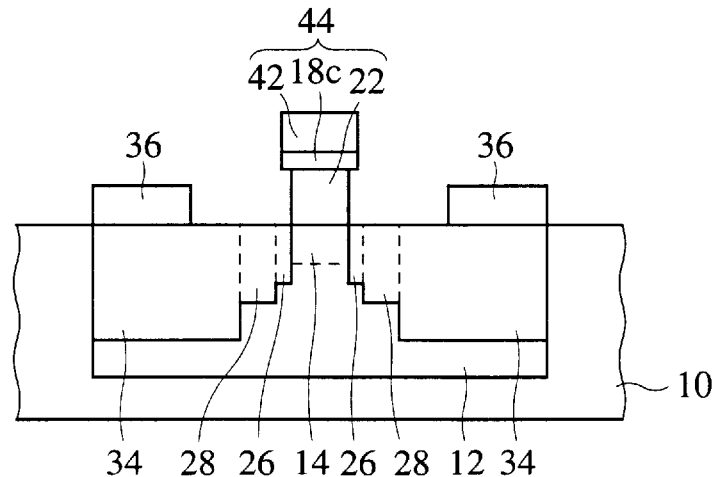
Figure 14A:
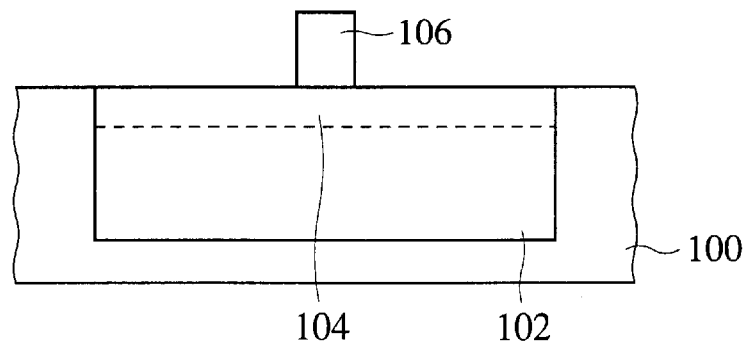
FIGS. 14A–14C are sectional views of a first conventional semiconductor device in the steps of the method for fabricating the same, which show the method (Part 1).
Figure 14B:
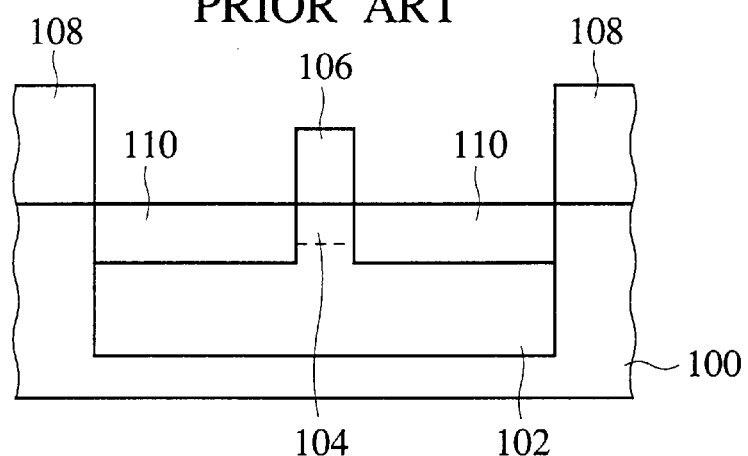
Figure 14C:
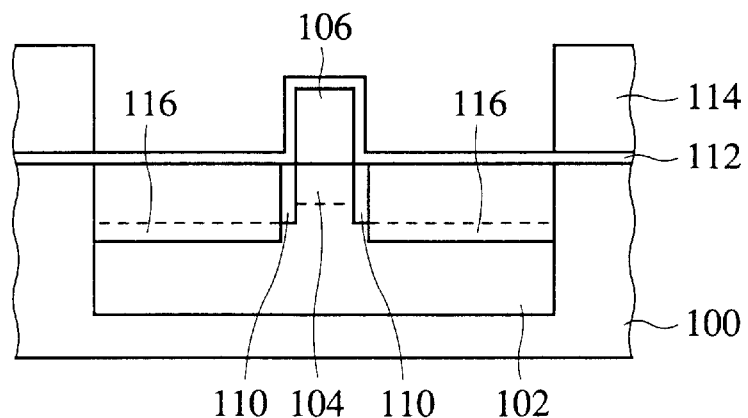
Figure 15A:
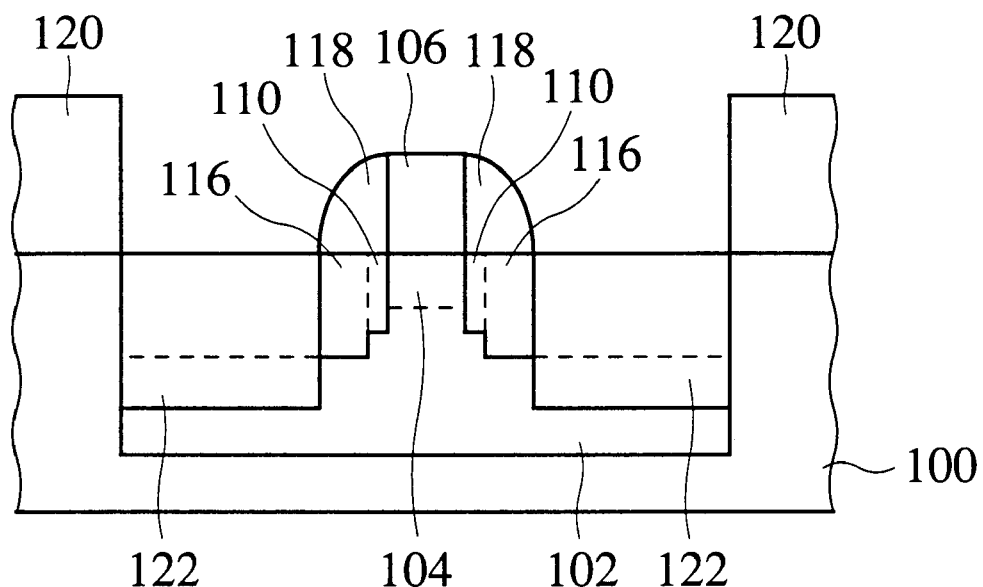
FIGS. 15A–15B are sectional views of the first conventional semiconductor device in the steps of the method for fabricating the same, which show the method (Part 2).
Figure 15B:
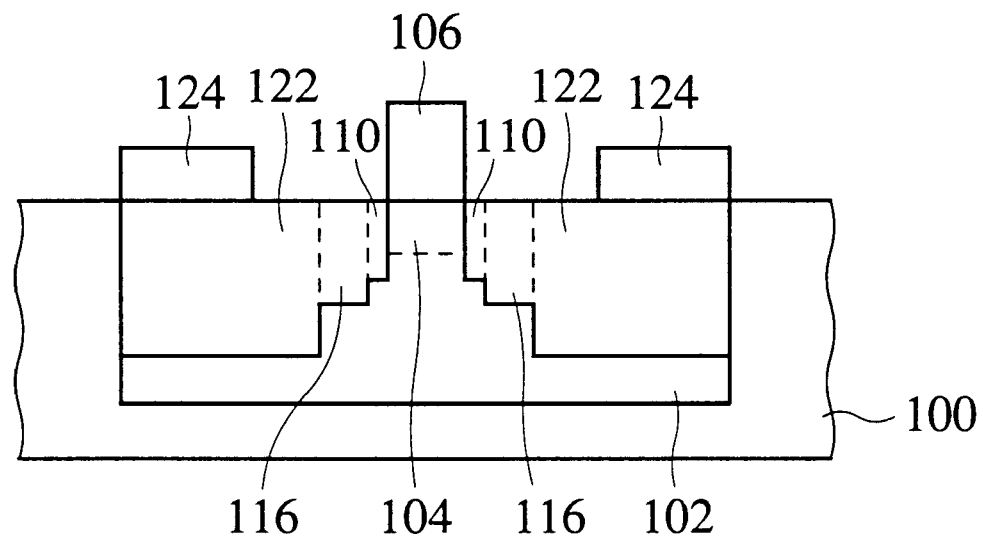
Figure 16A:
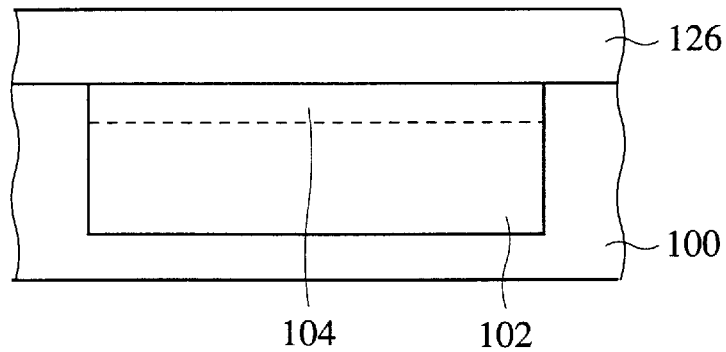
FIGS. 16A–16C are sectional views of a second conventional semiconductor device in the steps of the method for fabricating the same, which show the method (Part 1).
Figure 16B:
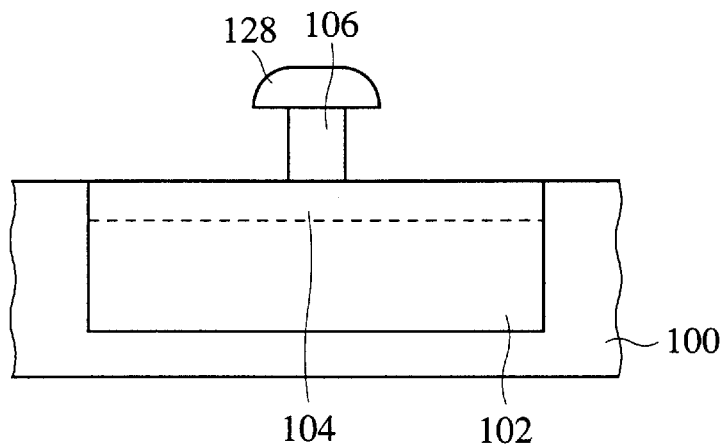
Figure 16C:
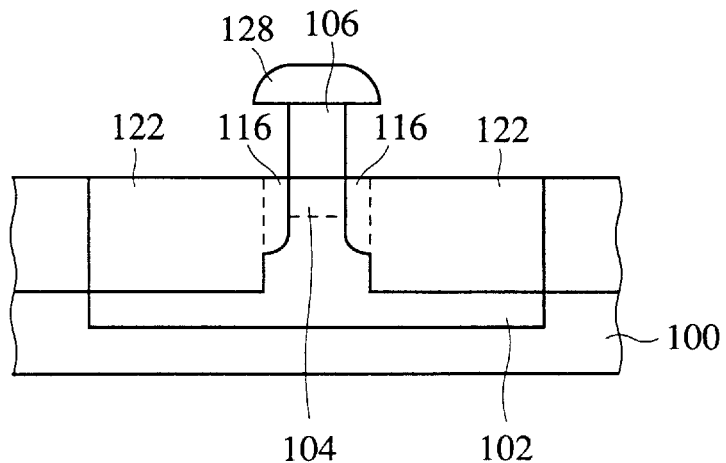
Figure 17A:
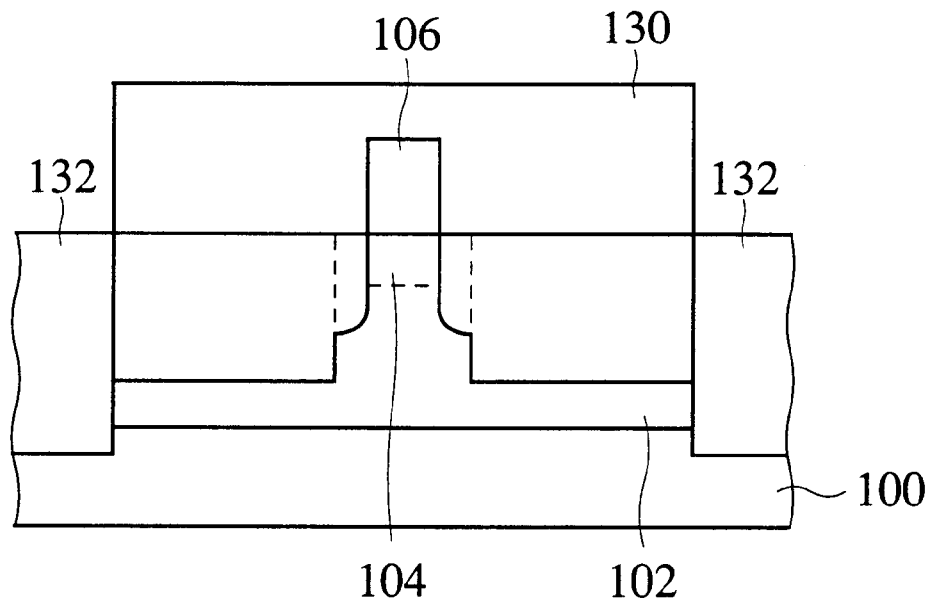
FIGS. 17A–17B are sectional views of the second conventional semiconductor device in the steps of the method for fabricating the same, which show the method (Part 2).
Figure 17B:
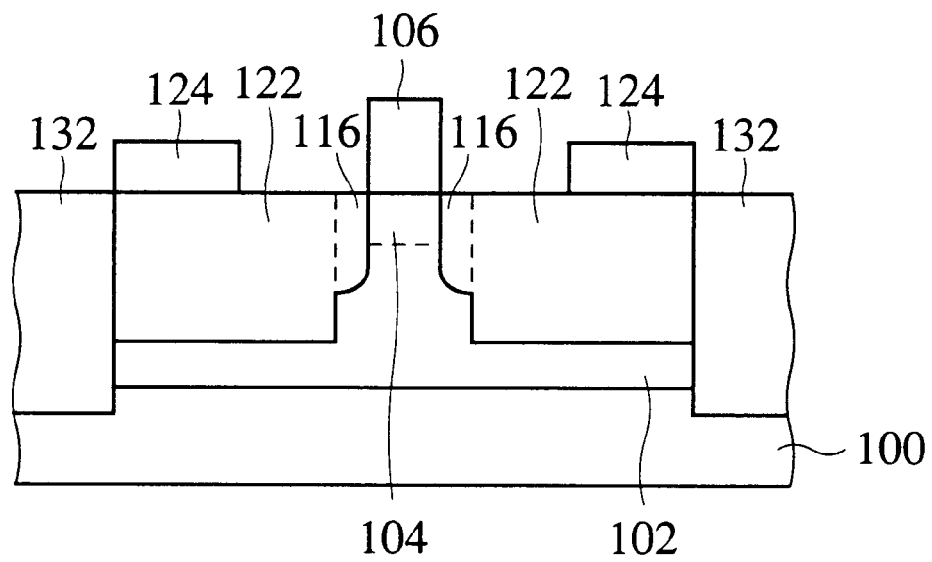

Next, an Au film 40 is deposited on the entire surface by, e.g., vacuum evaporation method (FIG. 13B). At this time, the Au film 40 is deposited also on the antireflection coating film 18c but is not deposited on the side wall of the gate electrode 22 because the width of the antireflection coating film 18c is larger than the width of the gate electrode 22. Accordingly, a distance between the Au film 40 and the GaAs substrate 10 is always defined by a thickness of the gate electrode 22 and kept substantially uniform.

Then, the Au film 40 on the resist 38 is removed together with the resist 38 to selectively leave the Au film 40 on the antireflection coating film 18c. Thus, the Au electrode 42 of the Au film 40 is formed on the antireflection coating film 18c, and the T-shaped gate electrode 44 formed of the gate electrode 22, the antireflection coating film 18c and the Au electrode 42.

Next, an ohmic electrode 36 is formed on the n$^+$-layer 34, and the MESFET is completed (FIG. 13C) Thus is formed a MESFET of the BP-LDD structure having the source/drain diffusion layer formed of the n"-layer 26, the n'-layer 28 and the n$^+$-layer 34 and having the T-shaped gate electrode 44.

The MESFET of the developed BP-LDD structure fabricated by the semiconductor fabrication method according to the present embodiment could have a 0.2 µm gate length, a 70 GHz shut-down frequency f$_t$ and a 90 GHz maximum transmission frequency.

As described above, according to the present embodiment, the antireflection coating film 18c having the eave-shaped structure is formed of TiN film, which is a conducting film, so that the T-shaped gate electrode 44 can be easily formed. Especially, in the T-shaped gate structure, when a distance between the substrate surface and the horizontal portion of the T-shape is small, parasitic capacity is increased, and shut-down frequency f$_t$ is decreased, and accordingly control of a height of the horizontal portion is a problem. However, in the present embodiment a height of the eave-shaped structure is defined by a height of the gate electrode 22, so that the film thickness can be easily controlled by forming the films uniform, and fluctuation of RF characteristics can be decreased.

In the present embodiment, the T-shaped gate electrode is applied to the semiconductor device fabrication method according to the first embodiment but is applicable also to the second and the third embodiments.

In the present embodiment, the gate electrode 22 is formed of WSi but may be formed of WSiN film or WN film as in the first embodiment.

What is claimed is:

1. A method for fabricating a semiconductor device comprising the steps of:

forming on a semiconductor substrate a gate electrode, and an eave-shaped film of a conductive material having an eave-shaped portion projected beyond an edge of the gate electrode formed on the upper surface of the gate electrode;

ion-implanting a dopant with the gate electrode as a mask and with the eave-shaped film as a through film to form a first diffusion layer in the semiconductor substrate immediately below the eave-shaped portion of the eave-shaped film and a second diffusion layer which is deeper and has a higher dopant concentration than the first diffusion layer, in the semiconductor substrate in a region where the eave-shaped film is not formed;

forming on the sidewall of the gate electrode a mask film having a larger width than that of the eave-shaped portion;

ion implanting a dopant with the mask film as a mask to form a third diffusion layer which is deeper and has a higher dopant concentration than the second diffusion layer; and forming an electrode layer on the eave-shaped film to form a T-shaped gate electrode formed of the gate electrode, the eave-shaped film and the electrode layer.

2. A method for fabricating a semiconductor device comprising the steps of:

forming on a semiconductor substrate a gate electrode, and an eave-shaped film of an inorganic material having an eave-shaped portion projected beyond an edge of the gate electrode formed on the upper surface of the gate electrode;

ion-implanting a dopant with the gate electrode as a mask and with the eave-shaped film as a through film to form a first diffusion layer in the semiconductor substrate immediately below the eave-shaped portion of the eave-shaped film and a second diffusion layer which is deeper and has a higher dopant concentration than the first diffusion layer, in the semiconductor substrate in a region where the eave-shaped film is not formed;

forming on the sidewall of the gate electrode a mask film having a larger width than that of the eave-shaped portion; and ion implanting a dopant with the mask film as a mask to form a third diffusion layer which is deeper and has a higher dopant concentration than the second diffusion layer, wherein in the step of forming the first diffusion layer and the second diffusion layer, the dopant is ion implanted at a prescribed angle to a normal to the semiconductor substrate to form a prescribed offset between the gate electrode and the first diffusion layer.

3. A method for fabricating a semiconductor device according to claim 2, wherein in the step of forming the first diffusion layer and the second diffusion layer, the second diffusion layer is formed outer of a vicinity of the edge of the gate electrode on one side of the gate electrode, and, on the other side of the gate electrode, the first diffusion layer with the prescribed offset from the edge of the gate electrode and the second diffusion layer are formed.

4. A method for fabricating a semiconductor device comprising the steps of:

forming on a semiconductor substrate a gate electrode, and an eave-shaped film of an inorganic material having an eave-shaped portion projected beyond an edge of the gate electrode formed on the upper surface of the gate electrode; and ion-implanting a dopant with the gate electrode as a mask and with the eave-shaped film as a through film to form a first diffusion layer in the semiconductor substrate immediately below the eave-shaped portion of the eave-shaped film and a second diffusion layer which is deeper and has a higher dopant concentration than the first diffusion layer, in the semiconductor substrate in a region where the eave-shaped film is not formed, wherein in the step of forming the first diffusion layer and the second diffusion layer, the dopant is ion implanted at a prescribed angle to a normal to the semiconductor substrate to form a prescribed offset between the gate electrode and the first diffusion layer, so that the second diffusion layer is formed outer of a vicinity of the edge of the gate electrode on one side of the gate electrode, and, on the other side of the gate electrode, the first diffusion layer with the prescribed offset from the edge of the gate electrode and the second diffusion layer are formed.

5. A method for fabricating a semiconductor device comprising the steps of:

forming on a semiconductor a gate electrode, and an eave-shaped film of an inorganic material having an eave-shaped portion projected beyond an edge of the gate electrode formed on the upper surface of the gate electrode;

ion-implanting a dopant with the gate electrode as a mask and with the eave-shaped film as a through film to form a first diffusion layer in the semiconductor substrate immediately below the eave-shaped portion of the eave-shaped film and a second diffusion layer which is deeper and has a higher dopant concentration than the first diffusion layer, in the semiconductor substrate in a region where the eave-shaped film is not formed;

removing the eave-shaped film;

forming on the sidewall of the gate electrode a mask film having a larger width than that of the eave-shaped portion after the step of forming the first diffusion layer and the second diffusion layer; and the step of ion implanting a dopant with the mask film as a mask to form a third diffusion layer which is deeper and has a higher dopant concentration than the second diffusion layer.

6. A method for fabricating a semiconductor device comprising the steps of:

forming a conducting film on a semiconductor substrate;

forming on the conducting film an antireflection coating film for suppressing reflection in photolithography;

forming on the antireflection coating film a first resist film having a pattern of a gate electrode by photolithography;

etching the antireflection coating film and the conducting film with the first resist film as a mask to form the gate electrode of the conducting film, and eave-shaped film formed of the antireflection coating film on the gate electrode and having an eave-shaped portion projected beyond the edge of the gate electrode; and ion-implanting a dopant with the gate electrode as a mask and with the eave-shape film as a through film to form a first diffusion layer in the semiconductor substrate immediately below the eave-shaped portion of the eave-shaped film and a second diffusion layer which is deeper and has a higher dopant concentration than the first diffusion layer, in the semiconductor substrate in a region where the eave-shaped film is not formed.

7. A method for fabricating a semiconductor device according to claim 6, wherein the antireflection coating film is formed of a material soluble in a developer for developing the first resist film, so that the antireflection coating film is patterned simultaneously with the development of the first resist.

8. A method for fabricating a semiconductor device according to claim 7, wherein the step of forming the first diffusion layer and a second diffusion layer includes the step of forming a second resist film on the semiconductor substrate with the gate electrode and the eave-shaped film formed on;

the step of forming a third resist film on the second resist film;

the step of patterning the third resist film by photolithography;

the step of etching the second resist film under conditions where the eave-shaped film is not to removed, with the patterned third resist film as a mask; and the step of ion implanting a dopant with the second resist film, the third resist film and the gate electrode as a mask and with the eave-shaped portion of the eave-shaped film as a through film.

9. A method for fabricating a semiconductor device according to claim 6, wherein the antireflection coating film is etched with the first resist film as a mask, and the conducting film is etched with the patterned antireflection coating film as a mask.

10. A method for fabricating a semiconductor device according to claim 6, further comprising the steps of:

removing the eave-shaped film after the step of forming the first diffusion layer and the second diffusion layer;

forming on the sidewall of the gate electrode a mask film having a larger width than that of the eave-shaped portion; and ion implanting a dopant with the mask film as a mask to form a third diffusion layer which is deeper and has a higher dopant concentration than the second diffusion layer.

* * * * *